US009208012B2

(12) United States Patent
Ikegami

(10) Patent No.: US 9,208,012 B2
(45) Date of Patent: Dec. 8, 2015

(54) DISPLAY PROCESSING SYSTEM, DISPLAY PROCESSING METHOD, AND PROGRAM

(75) Inventor: Teruya Ikegami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 303 days.

(21) Appl. No.: 13/823,824

(22) PCT Filed: Sep. 9, 2011

(86) PCT No.: PCT/JP2011/005090
§ 371 (c)(1),
(2), (4) Date: Apr. 29, 2013

(87) PCT Pub. No.: WO2012/073408
PCT Pub. Date: Jun. 7, 2012

(65) Prior Publication Data
US 2013/0212443 A1    Aug. 15, 2013

(30) Foreign Application Priority Data

Nov. 29, 2010   (JP) .................................. 2010-265476

(51) Int. Cl.
| G06F 11/00 | (2006.01) |
| G06F 11/07 | (2006.01) |
| G06F 1/20 | (2006.01) |
| G06F 11/30 | (2006.01) |
| G06F 1/32 | (2006.01) |
| H05K 7/20 | (2006.01) |

(52) U.S. Cl.
CPC ............ *G06F 11/0772* (2013.01); *G06F 1/206* (2013.01); *G06F 1/3203* (2013.01); *G06F 11/3058* (2013.01); *H05K 7/20836* (2013.01); *Y02B 60/1275* (2013.01)

(58) Field of Classification Search
CPC ... G06F 1/206; G06F 11/0751; G06F 11/076; G06F 11/0769; G06F 11/3058; G06F 11/321; G06F 11/324; G06F 11/237; G06F 11/328; Y02B 60/1275; H04L 41/22; H05K 7/20836
See application file for complete search history.

(56) References Cited

U.S. PATENT DOCUMENTS

| 5,822,512 A | 10/1998 | Goodrum et al. |
| 6,128,016 A * | 10/2000 | Coelho et al. ................. 715/808 |
| 6,145,098 A * | 11/2000 | Nouri et al. ..................... 714/31 |

(Continued)

FOREIGN PATENT DOCUMENTS

| CN | 1870750 | 11/2006 |
| EP | 0817055 | 1/1998 |

(Continued)

OTHER PUBLICATIONS

Kunio Fukumoto et al., Optimization of IT load and facility energy in data centers FUJITSU, May 10, 2010, vol. 61, No. 3, pp. 255-260.

(Continued)

*Primary Examiner* — Marc Duncan
(74) *Attorney, Agent, or Firm* — Young & Thompson

(57) ABSTRACT

A display processing system (1) includes a display unit (114) that displays occurrence status information of heat accumulation of a server, which provides a service for a predetermined period of time, and occurrence status information of a failure, which has occurred due to the heat accumulation for the predetermined period of time, according to a level of the effect of the failure on the service.

6 Claims, 13 Drawing Sheets

(56) References Cited

U.S. PATENT DOCUMENTS

| | | | |
|---|---|---|---|
| 6,188,973 B1 * | 2/2001 | Martinez et al. | 702/188 |
| 6,243,838 B1 * | 6/2001 | Liu et al. | 714/57 |
| 7,246,159 B2 * | 7/2007 | Aggarwal et al. | 709/220 |
| 7,596,431 B1 | 9/2009 | Forman et al. | |
| 7,894,944 B2 * | 2/2011 | Liu et al. | 700/276 |
| 8,484,510 B2 * | 7/2013 | Shankar et al. | 714/13 |
| 2004/0262409 A1 * | 12/2004 | Crippen et al. | 236/49.3 |
| 2005/0066026 A1 | 3/2005 | Chen et al. | |
| 2006/0047466 A1 * | 3/2006 | White | 702/130 |
| 2009/0113323 A1 * | 4/2009 | Zhao et al. | 715/764 |
| 2009/0210813 A1 * | 8/2009 | Sawczak et al. | 715/771 |
| 2009/0259345 A1 | 10/2009 | Kato et al. | |
| 2010/0146346 A1 * | 6/2010 | Johnson et al. | 714/48 |
| 2010/0328080 A1 * | 12/2010 | Tracy et al. | 340/584 |
| 2011/0057803 A1 * | 3/2011 | Yamaoka et al. | 340/584 |
| 2011/0107332 A1 * | 5/2011 | Bash | 718/1 |
| 2012/0116590 A1 * | 5/2012 | Florez-Larrahondo et al. | 700/275 |
| 2014/0039852 A1 * | 2/2014 | Zhang et al. | 703/2 |

FOREIGN PATENT DOCUMENTS

| | | |
|---|---|---|
| JP | 2005-092886 | 4/2005 |
| JP | 2008-157533 | 7/2008 |
| JP | 2009-169946 | 7/2009 |
| JP | 2009-252056 | 10/2009 |

OTHER PUBLICATIONS

International Search Report for PCT/JP2011/005090 mailed Oct. 25, 2011.

Chinese Office Action, dated Dec. 2, 2014, in corresponding Chinese Patent Application No. 201180053043.0.

Japanese Official Action—2012-546668—May 12, 2015.

* cited by examiner

| RANK | RESPONSE TIME | MINIMUM COMMUNI- CATION SPEED | UPPER LIMIT OF UNAVAILABLE TIME | |
|---|---|---|---|---|
| S | as1, as2 | bs1, bs2 | cs1, cs2 | |
| A | aa1, aa2 | ba1, ba2 | ca1, ca2 | |
| B | ab1, ab2 | bb1, bb2 | cb1, cb2 | |
| C | ac1, ac2 | bc1, bc2 | cc1, cc2 | |

150

(b)

| SERVER | RANK |
|---|---|
| PV1 | S |
| PV2 | A |
| PV3 | B |

152

FIG. 12
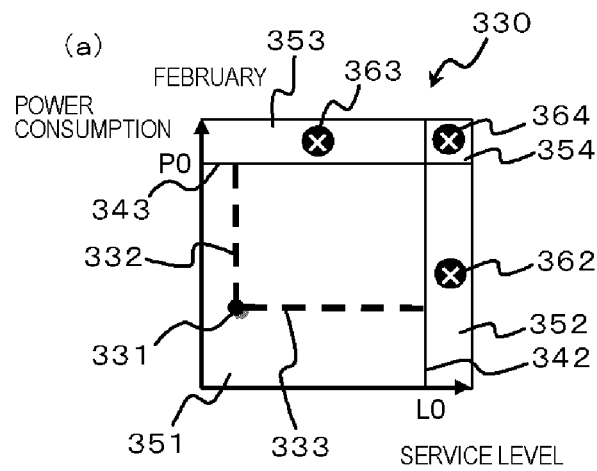
(a)
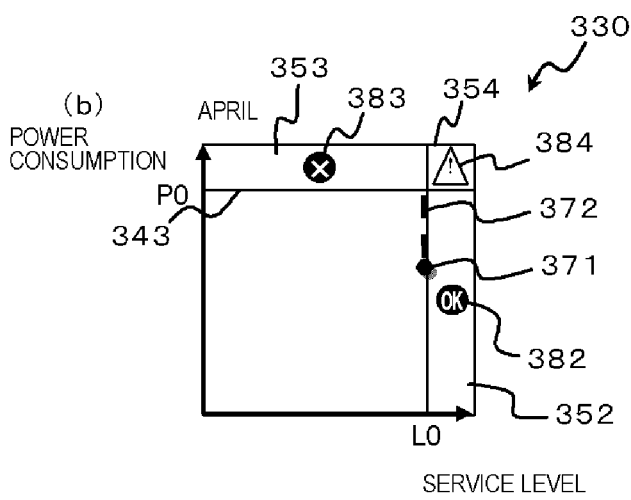
(b)
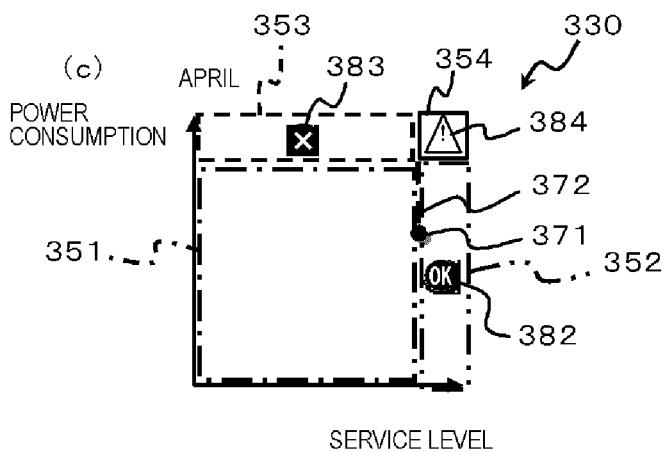
(c)

FIG. 13
(a)
TRANSITION OF AIR-CONDITIONING MANAGEMENT PERFORMANCE
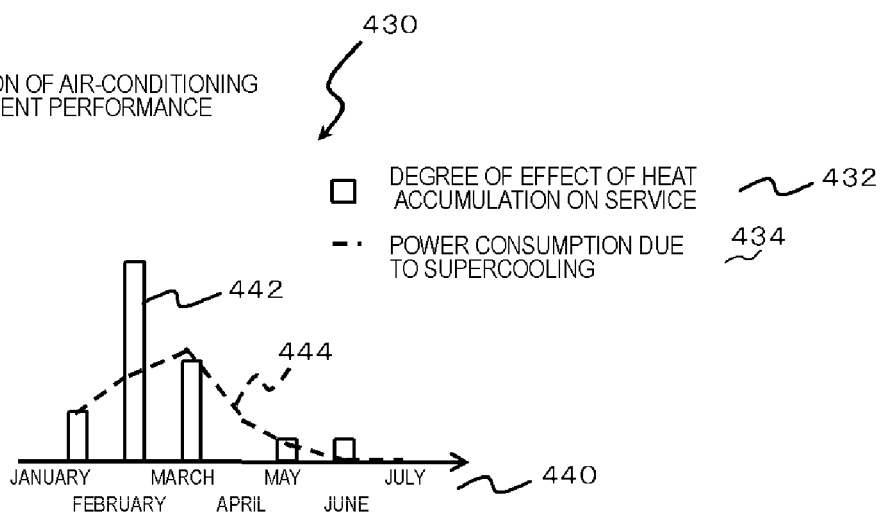
(b)
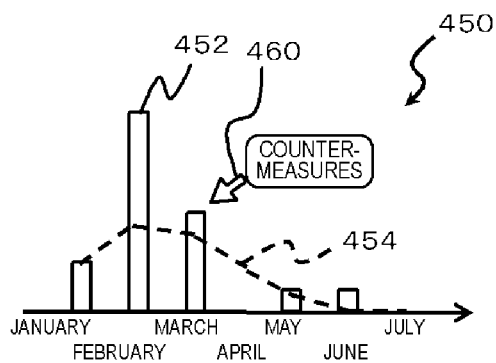

DISPLAY PROCESSING SYSTEM, DISPLAY PROCESSING METHOD, AND PROGRAM

TECHNICAL FIELD

The present invention relates to a display processing system, a display processing method, and a program, and in particular, to a display processing system, a display processing method, and a program for displaying management information of a system.

BACKGROUND ART

In recent years, as computers are used for cloud services, increases in the scales and the complexity of information technology (IT) equipment or services in a data center or the like are accelerating. Under such circumstances, it has been important issues how to operate and manage the system efficiently and how to ensure the reliability.

An example of the system for integrated management of the services provided is disclosed in Non-patent Document 1. In the system disclosed in Non-patent Document 1, abnormality information of current heat accumulation of a data center is displayed in a list or the like, and a floor map or the like showing the location of the occurrence of heat accumulation at the time of abnormalities is further displayed for a monitoring person. Accordingly, the monitoring person can check the location of the occurrence of heat accumulation on the floor map and take measures against the heat accumulation quickly.

In addition, Patent Document 1 discloses a configuration to acquire and store operating data including a power consumption of an air-conditioner and visualize the analyzed data. In addition, Patent Document 2 discloses that, in a system for remotely managing air-conditioning equipment in real time, a function of remotely monitoring air-conditioning equipment is realized by managing the operating state of a controlled air-conditioner in real time, and accordingly, air-conditioning cost is saved.

RELATED DOCUMENT

Patent Document

[Patent Document 1] Japanese Unexamined Patent Publication No. 2008-157533
[Patent Document 2] Japanese Unexamined Patent Publication No. 2009-169946

Non-Patent Document

[Non-patent Document 1] Hitachi, Ltd., "open middleware reports vol. 47", p. 31, [online], February, 2009, [Searched for on Sep. 6, 2010], Internet, <http://www.hitachi.co.jp/Prod/comp/soft1/omr/vol47/pdf/omr47.pdf>

DISCLOSURE OF THE INVENTION

In the techniques disclosed in the above-described Documents, in order to monitor the occurrence of heat accumulation or the like and take measures when an alarm goes off, a floor map of the heat accumulation occurrence location or the like may be displayed, and the power consumption required for cooling may also be displayed. In the techniques disclosed in the above-described Documents, however, displaying the relevance to the effect of a failure due to heat accumulation on the service in order to maintain the service level provided by the server, in which the heat accumulation has occurred, has not been performed.

The present invention has been made in view of the above-described situation, and it is an object of the present invention to provide a display processing system, a display processing method, and a program to improve the reliability of service.

A display processing system of the present invention includes a display unit that displays occurrence status information of heat accumulation of a server, which provides a service, for a predetermined period of time, and occurrence status information of a failure, which has occurred due to the heat accumulation for the predetermined period of time, according to a level of an effect of the failure on the service.

A display processing method of the present invention includes displaying, by a processing apparatus connected to a display device, occurrence status information of heat accumulation of a server that provides a service, for a predetermined period of time, and occurrence status information of a failure, which has occurred due to the heat accumulation for the predetermined period of time, on the display device according to a level of an effect of the failure on the service.

A program of the present invention causes a computer connected to a display device to execute a procedure for displaying occurrence status information of heat accumulation of a server that provides a service, for a predetermined period of time, and occurrence status information of a failure, which has occurred due to the heat accumulation for the predetermined period of time, on the display device according to a level of an effect of the failure on the service.

In addition, any combination of the above-described constituent elements and those obtained by converting the expression of the present invention into a method, an apparatus, a system, a recording medium, a computer program, and the like are also effective as aspects of the present invention.

In addition, various constituent elements of the present invention do not necessarily need to be separate entities. For example, a plurality of constituent elements may be formed as one member, one constituent element may be formed by a plurality of members, a certain constituent element may be a part of another constituent element, or a part of a certain constituent element and a part of another constituent element may overlap each other.

Moreover, although a plurality of procedures are described in order in the method and the computer program of the present invention, the described order does not limit the order in which the plurality of procedures is executed. Therefore, when executing the method and the computer program of the present invention, the order of the plurality of procedures may be changed in a range that does not interfere with the contents.

In addition, the plurality of procedures of the method and the computer program of the present invention is not limited to being executed at different timings. Therefore, for example, another procedure may occur during the execution of a certain procedure, or some or all of the execution timing of a certain procedure and the execution timing of another procedure may overlap each other.

According to the present invention, the display processing system, the display processing method, and the program to improve the reliability of service are provided.

BRIEF DESCRIPTION OF THE DRAWINGS

The above-described object and other objects, features, and advantages will become more apparent by preferred exemplary embodiments described below and the following accompanying drawings.

FIG. 6 is a diagram showing an example of the structure of a table stored in a service table storage unit of the display processing apparatus shown in FIG. 2.

FIG. 12 is a diagram showing an example of a display screen of the display processing system according to the exemplary embodiment of the present invention.

FIG. 13 is a diagram showing an example of a display screen of the display processing system according to the exemplary embodiment of the present invention.

DESCRIPTION OF EXEMPLARY EMBODIMENTS

Figure 1:
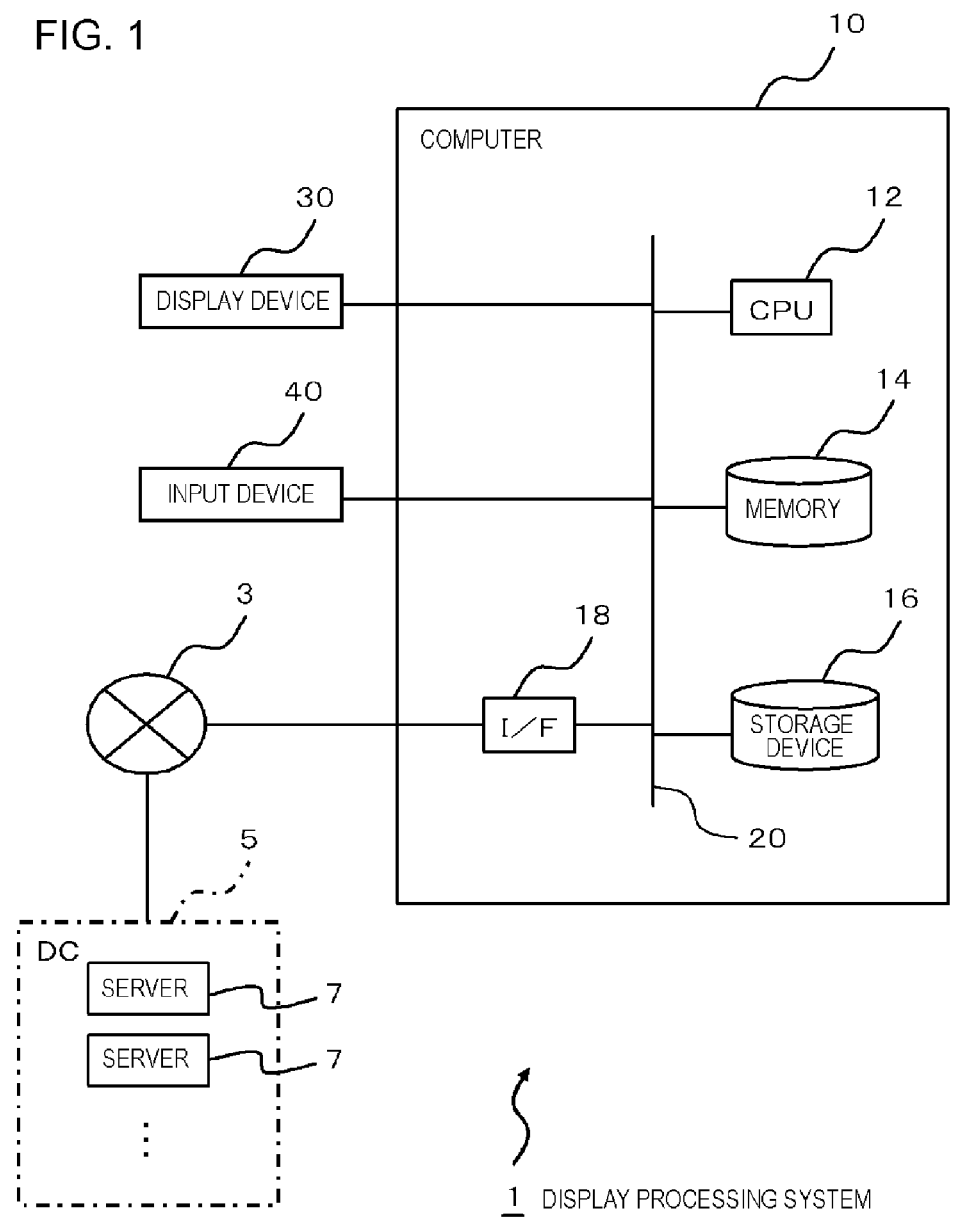
FIG. 1 is a block diagram showing the configuration of a display processing system according to an exemplary embodiment of the present invention.

Hereinafter, exemplary embodiments of the present invention will be described with reference to the drawings. In addition, the similar constitutional elements are denoted by the similar reference numerals in all drawings, and explanation thereof will not be repeated.

First Exemplary Embodiment

FIG. 1 is a block diagram showing the configuration of a display processing system 1 according to an exemplary embodiment of the present invention.

The display processing system 1 according to the exemplary embodiment of the present invention presents the information indicating the management situation of a large number of IT equipments of a data center (DC) 5 connected through a network 3, for example, information indicating the management situation of a large number of servers 7 or the service to an administrator who manages the system of the data center 5.

In a facility where a large number of IT equipments are housed in a rack and a number of racks are arranged in a room, such as a data center 5, heat accumulation may occur due to the heat generated by the IT equipments. Against the heat accumulation, measures, such as cooling using air-conditioning, are taken. The display processing system 1 of the present invention presents the information by which it is possible to grasp at a glance whether or not the measures are properly taken.

In addition, in the present exemplary embodiment, it may be assumed that the operating rules are determined in advance between service users and service providers according to the service level agreement (SLA) and the like. This SLA is a system for a service provider, who provides the service using the servers 7 of the data center 5, to guarantee the quality level of the service, which is provided to the service user, for the service user. In addition, in the SLA, the guaranteed quality level of service is set for various items according to the rank. For example, it is assumed that the maximum value of response time, the minimum communication speed, the upper limit of unavailable service time, and the like are determined for each rank. In addition, explanation will be given on the assumption that four ranks of S, A, B, and C are set in descending order of quality in the present exemplary embodiment.

In addition, in the display processing system 1 of the present exemplary embodiment, it is preferable that supervisors, managers, or the like among administrators of the data center 5 can grasp at a glance not only the situation of the occurrence of a failure due to heat accumulation but also whether or not the quality of service can be maintained when they view the screen.

The display processing system 1 has a computer 10 including a CPU 12, a memory 14, a storage device 16 such as a hard disk, and a communication device (interface for network connections ("I/F" in the drawings) 18), for example. The CPU 12 is connected to each constitutional element of the computer 10 through a bus 20, and controls the entire computer 10 as well as each constitutional element. The computer 10 of the display processing system 1 may be realized by a server computer or a personal computer, which is connected to an input device 40 such as a keyboard or a mouse, a display device 30 such as a display, or an output device (not shown in the drawings) such as a printer, or apparatuses equivalent to these. In addition, the CPU 12 may realize each function of each unit described below by reading a program stored in the storage device 16 into the memory 14 and executes it.

In addition, in each drawing, the configuration of units not relevant to the essence of the present invention is omitted and is not shown.

Figure 2:
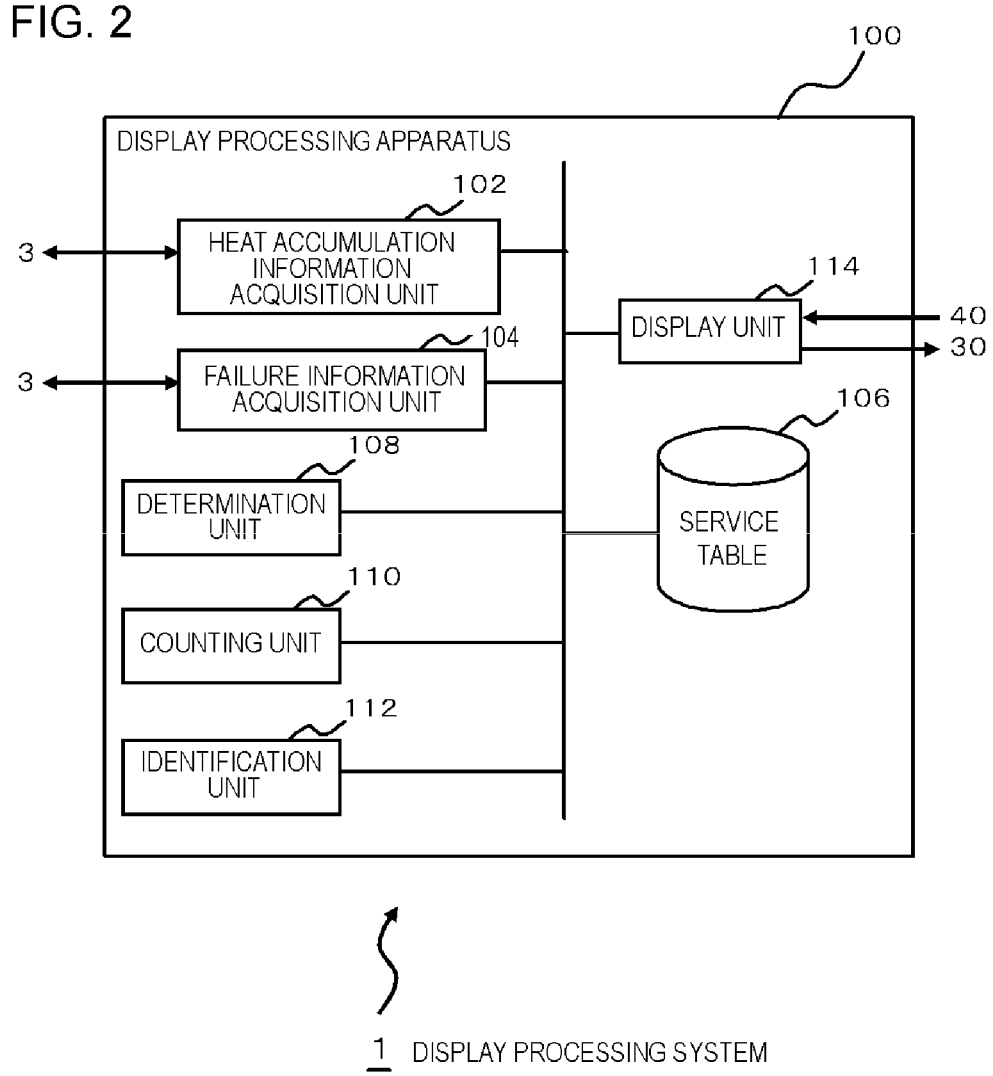
FIG. 2 is a functional block diagram showing the configuration of a display processing apparatus of the display processing system according to the exemplary embodiment of the present invention.

FIG. 2 is a functional block diagram showing the configuration of a display processing apparatus 100 realized by the computer 10 of the display processing system 1 according to the exemplary embodiment of the present invention.

As shown in FIG. 2, the display processing system 1 of the present exemplary embodiment includes a display unit 114 that displays the occurrence status information of heat accumulation of the servers 7 (FIG. 1), which provides the service, for a predetermined period of time, and the occurrence status information of a failure, which has occurred due to heat accumulation for the predetermined period of time, according to the level of the effect of the failure on the service.

In addition, each constitutional element of the display processing apparatus 100 is realized by any combination of hardware and software of the computer 10 including the CPU 12, the memory 14, a program for realizing the constitutional elements in FIG. 1 which is loaded into the memory 14, the storage device 16 such as a hard disk which stores the program, and the interface for network connection 18, which have been described with reference to FIG. 1. In addition, it will be understood by those skilled in the art that various modifications of the implementation method and the apparatus may be made. Each drawing described below does not show the configuration of a hardware unit but shows a block of a functional unit.

The computer program of the present exemplary embodiment is described so as to cause the computer 10 (FIG. 1) for realizing the display processing apparatus 100 to execute a procedure for displaying the occurrence status information of heat accumulation of the servers 7 (FIG. 1), which provides the service, for a predetermined period of time, and the occurrence status information of a failure, which has occurred due to heat accumulation for the predetermined period of time, on the display device 30 (FIG. 1) according to the level of the effect of the failure on the service.

The computer program of the present exemplary embodiment may be recorded on a computer-readable recording medium. The recording medium is not particularly limited, and various forms of recording media may be used. In addition, a program may be loaded from the recording medium into the memory of the computer, or may be downloaded to the computer through the network and be loaded into the memory.

Specifically, the display processing apparatus 100 includes a heat accumulation information acquisition unit 102, a failure information acquisition unit 104, a service table storage unit (indicated as a "service table" in the drawings) 106, a determination unit 108, a counting unit 110, an identification unit 112, and the display unit 114.

The heat accumulation information acquisition unit 102 acquires the occurrence status information of heat accumulation of the servers 7 (FIG. 1), which provides the service, through the network 3.

Figure 4:
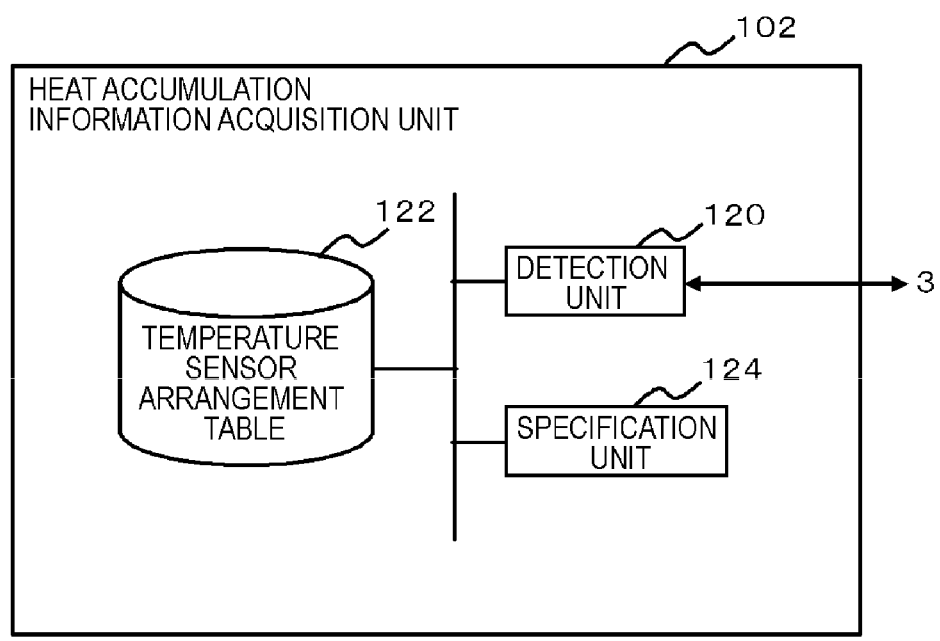
FIG. 4 is a functional block diagram showing an example of the configuration of a heat accumulation information acquisition unit of the display processing apparatus shown in FIG. 2.

As shown in FIG. 4, the heat accumulation information acquisition unit 102 may further include a detection unit 120, a temperature sensor arrangement table storage unit (indicated as a "temperature sensor arrangement table" in the drawings) 122, and a specification unit 124.

The detection unit 120 receives the temperature information measured by temperature sensors (not shown in the drawings), which are arranged around the servers 7 that provides the service from a management device (not shown in the drawings) of the data center 5 (FIG. 1) through the network 3, and detects the occurrence of heat accumulation on the basis of the received temperature information. The detection unit 120 detects the occurrence of heat accumulation on the basis of the position and the period when the temperature information of the temperature sensor is equal to or more than a threshold value set in advance.

The temperature sensor arrangement table storage unit 122 stores a correspondence table of the arrangement of the servers 7 and the temperature sensors. The temperature sensor arrangement table storage unit 122 is included in the memory 14 or the storage device 16. The specification unit 124 specifies at least one server 7, in which the detected heat accumulation has occurred, with reference to the temperature sensor arrangement table storage unit 122, and outputs the occurrence status information of heat accumulation of the specified server 7.

In addition, the heat accumulation occurrence status information in the above configuration may be generated by the management device of the data center 5 and be transmitted to the display processing apparatus 100.

Referring back to FIG. 2, the failure information acquisition unit 104 acquires the occurrence status information of a failure, which has occurred in the service or the server 7 (FIG. 1), from the data center 5 through the network 3.

The heat accumulation occurrence status information or the failure occurrence status information collected from the server 7 may be stored in the memory 14 or the storage device 16 periodically or when necessary. In addition, the heat accumulation information acquisition unit 102 and the failure information acquisition unit 104 of the display processing apparatus 100 may use the values stored in the memory 14 or the storage device 16. Alternatively, the display processing apparatus 100 may also read and acquire each item of target information of a computer, which is collected from each server 7 or management device, from a recording medium in which the information of a fixed period is recorded in advance. Thus, each item of information may be acquired at a variety of timing using various methods.

The service table storage unit 106 stores a server table which associates the services provided by the servers 7 with the SLA ranks. The service table storage unit 106 is included in the memory 14 or the storage device 16. In addition, the server table may include two tables of a correspondence table between the server 7 and the service and a correspondence table between the service and the SLA rank. Various tables stored in the service table storage unit 106 may be checked and changed by the operator from a setting screen (not shown in the drawings).

In the present exemplary embodiment, the service table storage unit 106 stores a failure level table 150 shown in FIG. 6(a) and a server rank table 152 shown in FIG. 6(b). In the server rank table 152, the SLA rank set in advance is stored so as to be associated with each server 7 of the data center 5. In addition, the service provided by the server 7 may be often changed by resource allocation. If the service provided by the server 7 is changed, the server rank table 152 is rewritten when necessary.

In the failure level table 150, a reference value set for each monitoring item is stored for each SLA rank. Examples of the monitoring item include response time, minimum communication speed, and an upper limit of unavailable time. For each monitoring item of each rank, two different threshold values, for example, first and second threshold values as1 and as2 are set as reference values. Here, the first threshold as1 may be set as a value which violates the SLA, for example. In addition, the second threshold as2 may be set as a reference value for warning before the violation of the SLA, for example. In this example, two threshold values are set for each monitoring item of each rank. However, the present invention is not limited thereto. Although the number of threshold values may be 1 or more, it is preferable that the number of threshold values be 2 or more.

The identification unit 112 identifies and classifies the counted failure occurrence status information for the predetermined period of time on the basis of different criteria (threshold values) according to the level (violation of the SLA and warning) of the effect of the failure on the service which is set for each quality assurance level (SLA rank) of the service.

By preparing a plurality of different threshold values for each rank as described above, the effect on the quality of service demanded at the level changing with a rank may be monitored at a plurality of levels. In the present exemplary embodiment, it is possible to specify the SLA rank of the service provided by the server 7 in which a failure has occurred and to identify the level of the effect of the failure with the criteria (threshold values) corresponding to the rank.

In addition, one reference value (first threshold value) may be set for each rank for a certain monitoring item, and the value for calculating another reference value (second threshold value) to give warning may be set in common for ranks. Alternatively, one reference value (first threshold value) may be set in common for ranks for a certain monitoring item, and the value for calculating another reference value (second threshold value) to give warning may be set for each rank. In the present exemplary embodiment, since the first threshold is a value set in advance for each rank by the SLA, it is desirable to adopt a value specified by the SLA. On the other hand, an administrator may arbitrarily set threshold values other than the first threshold value. The display processing apparatus 100 of the present exemplary embodiment may provide a user interface for operation reception, such as a setting screen (not shown in the drawings). These values may be set in advance or may be set or changed when necessary through the setting screen operated by the operator.

The determination unit 108 determines that failures in the server 7 and the service have occurred due to heat accumulation when the server 7 in which heat accumulation has occurred, of which information has been acquired by the heat accumulation information acquisition unit 102, matches the server 7 in which a failure has occurred, of which information has been acquired by the failure information acquisition unit 104. Alternatively, in another exemplary embodiment, a failure due to heat accumulation may be detected by the management device (not shown in the drawings) of the server 7 in the data center 5. In addition, the display processing apparatus 100 may acquire the information of a failure, which occurs due to heat accumulation of the server 7, from the management device.

The counting unit 110 counts the acquired occurrence status information of heat accumulation of the server 7 and the occurrence status information of a failure, which is determined to have occurred due to heat accumulation, for the predetermined period of time. In the present exemplary embodiment, the counting unit 110 counts the number of occurrences of heat accumulation within the predetermined period of time.

In the present exemplary embodiment, the predetermined period of time for which counting is performed may be designated in advance by the operator or may be changed when necessary by the operator, and at least one designated period of a day, a week, a month, three months, six months, a year, two or more years, and any designated period may be set, for example. This predetermined period of time may be selected in advance or may be selected when necessary through a setting screen (not shown in the drawings) operated by the operator.

In addition, the definition of the number of occurrences of heat accumulation may also be designated in advance by the operator. Various designation methods may be considered as illustrated below.

(1) Heat accumulation which has occurred at the same location for several days is counted as one case or counted as the number of days.

(2) Heat accumulation when the magnitude of heat accumulation is large and a plurality of servers 7 are associated with the heat accumulation is counted as one case, or counted as the number of associated servers 7, or counted for each associated server.

It is assumed that the above may be designated separately and arbitrarily.

The identification unit 112 specifies the SLA rank of the service provided by the server 7, which is determined that the failure has occurred, on the basis of the server rank table 152 with reference to the service table storage unit 106. In addition, the identification unit 112 identifies the level of the effect of the failure on the service from the reference value of the specified rank on the basis of the failure level table 150, and performs classification regarding whether the identified level is a warning level or an SLA violation level, for example. Here, the effect level may be divided into determination results based on the first and second threshold values set for each monitoring item described above.

For example, when the response time exceeds the second threshold value in the failure occurrence status information, the level of the effect on the service is classified into the warning level. When the response time exceeds the first threshold value, the level of the effect on the service is classified into the SLA violation level.

The display unit 114 displays the counted heat accumulation occurrence status information for the predetermined period of time and the occurrence status information of a failure, which has occurred due to heat accumulation for the predetermined period of time, on the display device 30 (FIG. 1) according to the level of the effect on the service classified by the identification unit 112.

Figure 3:
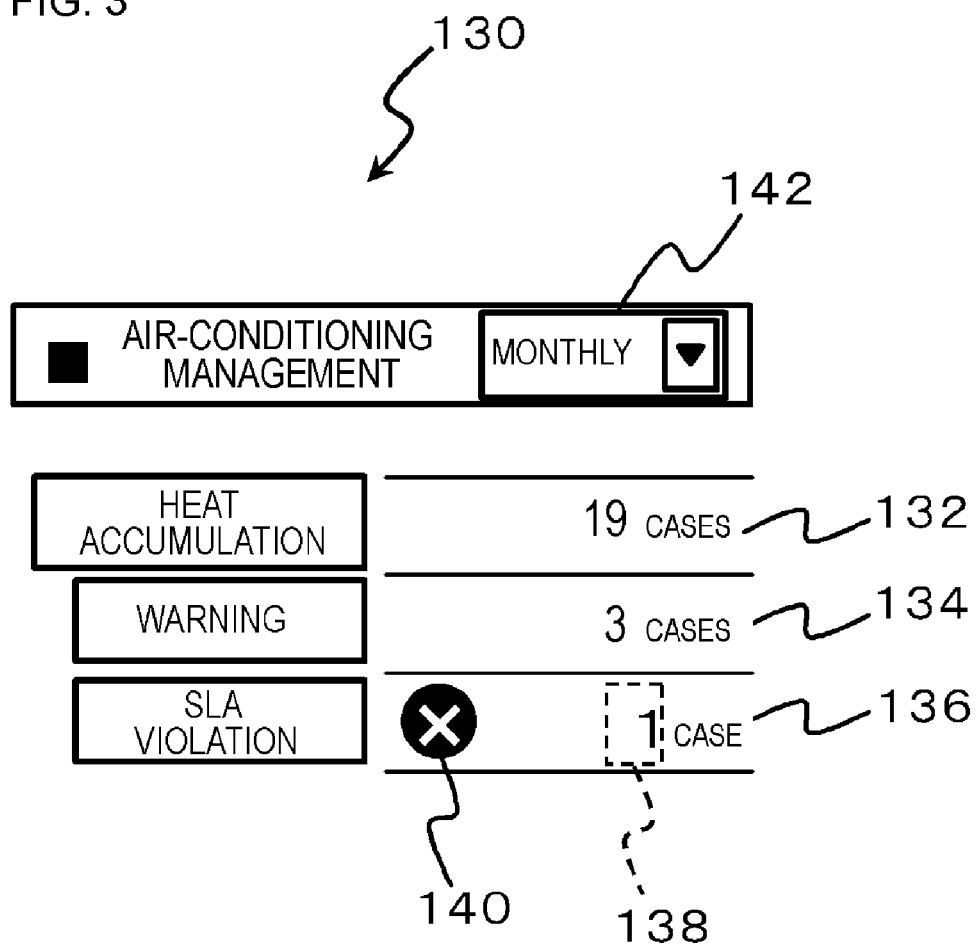
FIG. 3 is a diagram showing an example of a display screen of the display processing system according to the exemplary embodiment of the present invention.

FIG. 3 is a diagram showing an example of a screen 130 of the display processing system 1 of the present exemplary embodiment.

As shown in FIG. 3, the screen 130, which is displayed on the display device 30 (FIG. 1) by the display unit 114 (FIG. 2), includes a display portion of the number of occurrences of heat accumulation 132, a display portion of the number of occurrences of warning 134, and a display portion of the number of occurrences of SLA violation 136. In addition, a period selection list 142 may be provided on the screen 130. Using the period selection list 142, an operation to select the counting period of the number of occurrences displayed in the display portion of the number of occurrences of heat accumulation 132, the display portion of the number of occurrences of warning 134, and the display portion of the number of occurrences of SLA violation 136 may be received. The counting period may be selected from predetermined periods of time as described above. In FIG. 3, the counting result of the past one month is displayed.

In addition, although a configuration of displaying only the recent history is adopted in the present exemplary embodiment, the present invention is not limited thereto. The past may also be referred to. In the present invention, however, it is not an object to investigate the cause and the like of a failure that has occurred by viewing the screen 130, but it is preferable to display at least the current situation. This is because, in the present invention, priorities are given to being able to recognize that there is no effect of a failure on the quality of the service, being able to recognize the effect quickly when there is an effect on the quality, being able to recognize how much the quality has been affected, and being able to recognize the degree of seriousness.

The number of occurrences of heat accumulation counted for a predetermined period of time selected from the period selection list 142 by the counting unit 110 is displayed in the display portion of the number of occurrences of heat accumulation 132. The number of occurrences of warning counted for a predetermined period of time selected from the period selection list 142 by the counting unit 110 is displayed in the display portion of the number of occurrences of warning 134. The number of occurrences of SLA violation counted for a predetermined period of time selected from the period selection list 142 by the counting unit 110 is displayed in the display portion of the number of occurrences of SLA violation 136.

In addition, on the screen 130, when the number of occurrences of SLA violation is equal to or more than a predetermined number of occurrences (in the present exemplary embodiment, 1), highlighting 138 of the display portion of the number of occurrences is performed, and an icon 140 for notifying the administrator that the SLA violation has occurred is displayed near the display portion of the number of occurrences of SLA violation 136. As examples of the highlighting 138, various methods, such as changing the color to red, making the character thick, making the character blink, and changing the background color for highlighting, may be considered. In the present exemplary embodiment, for example, a red circle having an x mark drawn therein is used as the icon 140. However, the icon 140 is not limited thereto. For example, the color of the icon 140 may be yellow, and the shape of the icon 140 may be other shapes. The image in the icon 140 may be other characters or symbols, such as "NG", or may be other images. It is preferable to use an image by which an operator can recognize the occurrence of SLA violation visually intuitively at a glance.

Through the display of the icon 140 or the highlighting 138, the administrator who sees the screen 130 can easily recognize warning, such as the occurrence of SLA violation, visually intuitively. Although not shown in FIG. 3, similarly for the display portion of the number of occurrences of heat accumulation 132 or the display portion of the number of occurrences of warning 134, the warning can be easily recognized visually intuitively by highlighting the display portion of the number of occurrences or displaying the icon near the display portion of the number of occurrences when the number of occurrences of heat accumulation or the number of occurrences of warning is equal to or more than a predetermined number of occurrences. The predetermined number of occurrences for highlighting or icon display may be set in advance or may be set and changed when necessary through a setting screen (not shown in the drawings) operated by the operator.

The operation of the display processing system 1 of the present exemplary embodiment configured in this manner will be described below.

Figure 5:
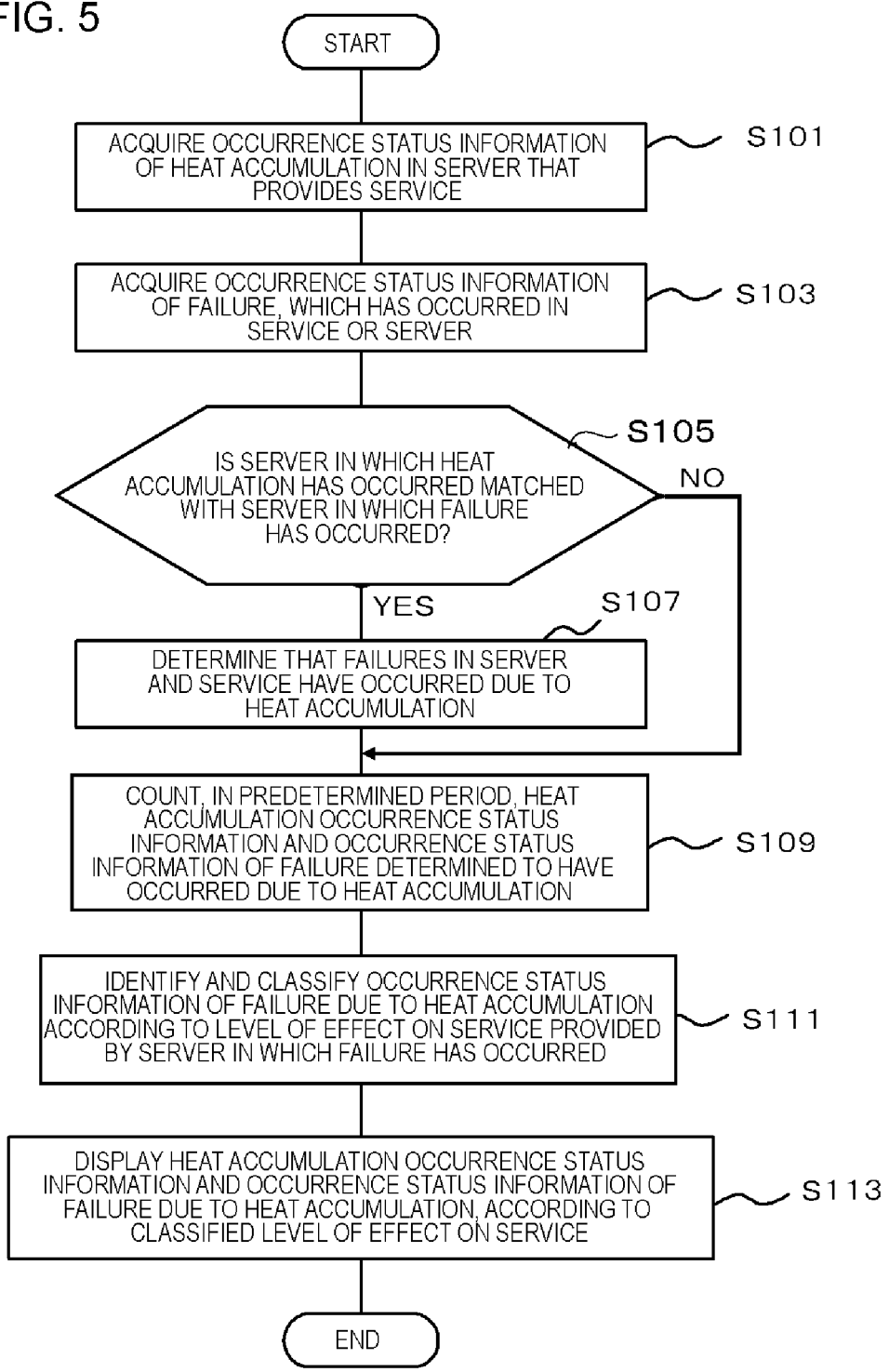
FIG. 5 is a flow chart showing an example of the operation of the display processing system according to the exemplary embodiment of the present invention.

FIG. 5 is a flow chart showing an example of the operation of the display processing system 1 of the present exemplary embodiment. Hereinafter, the flow chart will be described with reference to FIGS. 1 to 6.

In the display processing method of the present exemplary embodiment, the occurrence status information of heat accumulation of the server 7 (FIG. 1), which provides the service, for a predetermined period of time, and the occurrence status information of a failure, which has occurred due to heat accumulation for the predetermined period of time, are displayed on the display device 30 (FIG. 1) according to the level of the effect of the failure on the service (step S113 in FIG. 5).

Specifically, in the display processing system 1 (FIG. 2) of the present exemplary embodiment, first, the heat accumulation information acquisition unit 102 (FIG. 2) of the display processing apparatus 100 acquires the occurrence status information of heat accumulation of the server 7, which provides the service, through the network 3 (FIG. 2) (step S101). Then, the failure information acquisition unit 104 (FIG. 2) of the display processing apparatus 100 acquires the occurrence status information of a failure, which has occurred in the service or the server 7, from the data center 5 (FIG. 1) through the network 3 (step S103).

Then, the determination unit 108 (FIG. 2) of the display processing apparatus 100 determines whether or not the server 7 in which the heat accumulation has occurred, of which information has been acquired by the heat accumulation information acquisition unit 102, matches the server 7 in which the failure has occurred, of which information has been acquired by the failure information acquisition unit 104 (step S105). When the server 7 in which the heat accumulation has occurred matches the server 7 in which the failure has occurred (YES in step S105), it is determined that the failures in the server 7 and the service have occurred due to heat accumulation (step S107), and the process proceeds to step S109. When the server 7 in which the heat accumulation has occurred does not match the server 7 in which the failure has occurred (NO in step S105), step S107 is skipped and the process proceeds to step S109 since the failures have not occurred due to heat accumulation.

Then, the counting unit 110 (FIG. 2) of the display processing apparatus 100 counts the acquired occurrence status information of heat accumulation of the server 7 and the occurrence status information of the failure, which is determined to have occurred due to the heat accumulation, for the predetermined period of time (step S109).

In addition, although the process of steps S101 to S107 may be constantly and repeatedly executed at predetermined periods of time and step S109 may be executed in every period, the explanation of the repeated process will not be repeated in this drawing.

Then, the identification unit 112 (FIG. 2) of the display processing apparatus 100 specifies the SLA rank of the service provided by the server 7, which has been determined that the failure occurred, on the basis of the server rank table 152 (FIG. 6(b)) with reference to the service table storage unit 106 (FIG. 2) of the display processing apparatus 100. Then, the identification unit 112 of the display processing apparatus 100 identifies the level of the effect of the failure on the service from the reference value of the specified rank on the basis of the failure level table 150 (FIG. 6(a)), and performs classification regarding whether the identified level is a warning level or an SLA violation level, for example (step S111).

Then, the display unit 114 (FIG. 2) of the display processing apparatus 100 displays the counted heat accumulation occurrence status information for the predetermined period of time and the occurrence status information of a failure, which has occurred due to heat accumulation for the predetermined period of time, according to the level of the effect on the service classified by the identification unit 112 of the display processing apparatus 100 (step S113).

As described above, the number of occurrences of heat accumulation that have occurred in a month, the number of occurrences of warning that has occurred due to heat accumulation, and the number of occurrences of SLA violation are displayed on the screen 130 in FIG. 3. Here, it can be grasped at a glance, through the icon 140 and the highlighting 138, that SLA violation has occurred due to failure caused by heat accumulation.

It should be noted that, as described above, the counting process of step S109 does not necessarily need to be performed at predetermined periods of time. The counting process of step S109 may be performed at the timing when the counted value in each predetermined period of time can be calculated. In addition, the display update process of step S113 may be performed only when the operator gives an instruction to display the screen 130 with an operation button (not shown in the drawings) or the like. In addition, in a state where the screen 130 is displayed by the display unit 114, when the information to be displayed in the display portion of the number of occurrences of heat accumulation 132, the display portion of the number of occurrences of warning 134, and the display portion of the number of occurrences of SLA violation 136 has changed, especially, when warning or SLA violation occurs, it is preferable to update the display immediately. Here, whether to set the display update as automatic update or manual update using an operation button (not shown in the drawings) or the like, an automatic update period, and the like may be set in advance or may be set and changed when necessary through a setting screen (not shown in the drawings) operated by the operator.

As described above, according to the display processing system 1 of the present exemplary embodiment, a situation of the occurrence of a failure due to heat accumulation for a predetermined period of time and the level of the effect on the service can be visualized so as to be associated with each other.

It is undoubtedly essential to detect heat accumulation and take measures against it. In order to do so, it is necessary to check the detailed failure information. In the display processing system 1 of the present invention, however, the purpose is to know schematically how much the occurrence of heat accumulation has influenced the service provided rather than presenting detailed information.

According to the present invention, it is possible to present easy-to-understand information regarding maintaining the quality of the service by presenting the heat accumulation occurrence situation for a predetermined period of time, the number of occurrences of failure resulting therefrom, and the level of the effect on the quality of service. In addition, according to the present invention, the situation maintaining the quality of service provided can be easily grasped. Therefore, when a problem occurs, it is possible to be quickly aware of the problem and take measures against the problem. As a result, the reliability of service is improved.

Second Exemplary Embodiment

Figure 7:
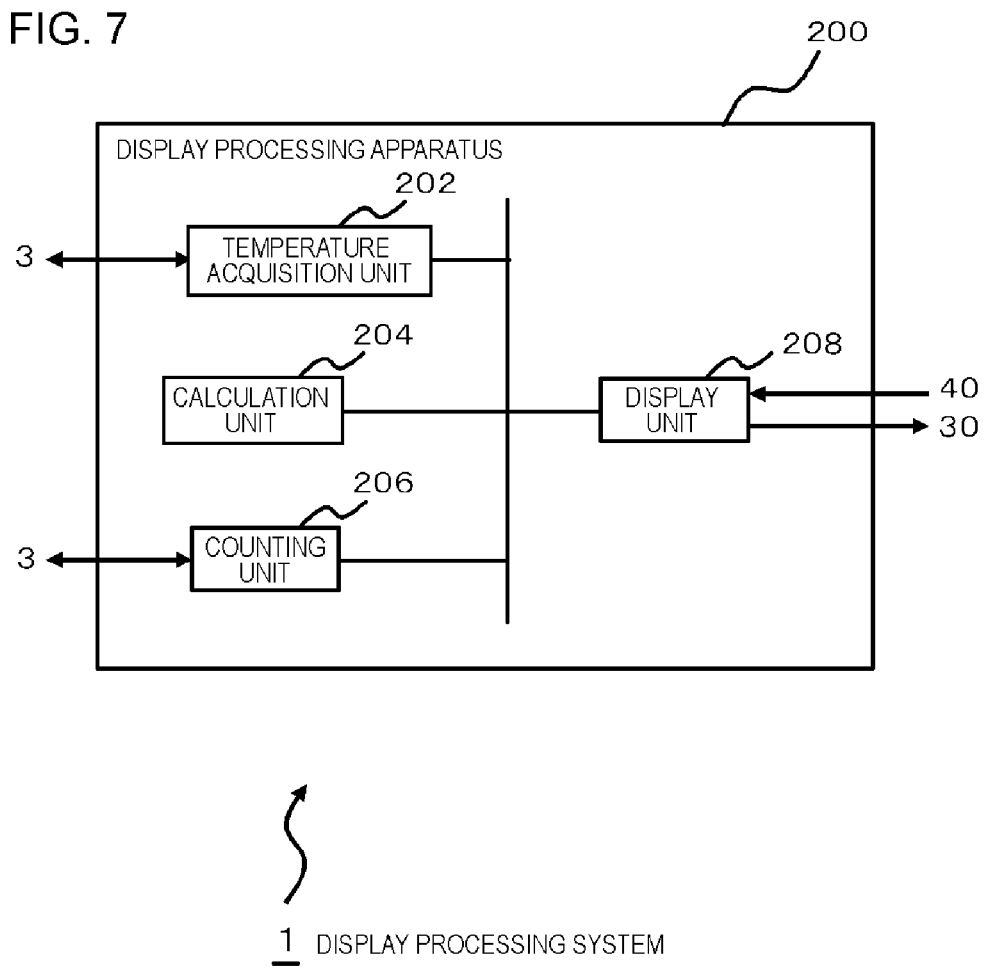
FIG. 7 is a functional block diagram showing the configuration of a display processing apparatus of a display processing system according to an exemplary embodiment of the present invention.

FIG. 7 is a functional block diagram showing the configuration of a display processing apparatus 200 realized by the computer of the display processing system 1 according to the exemplary embodiment of the present invention. The display processing system 1 of the present exemplary embodiment is different from the display processing system of the above-described exemplary embodiment in that not only the effect of heat accumulation on the service but also energy efficiency are displayed.

In a facility where a number of IT equipment is housed in a rack and a number of racks are arranged in a room, such as the data center 5 (FIG. 1), heat accumulation may occur due to the heat generated by the IT equipment. To prevent the heat accumulation, measures, such as cooling using air-conditioning, are taken. The display processing system 1 of the present exemplary embodiment presents information by which it is possible to grasp at a glance whether or not the measures are properly performed.

In addition, there is usually no person on the floor where IT equipment is installed. Accordingly, even if the floor becomes wastefully cool from air-conditioning, it may not be noticed by anybody. Supercooling is not desirable from the environmental perspective. The display processing system 1 of the present invention presents the information by which it is possible to grasp at a glance whether or not the electrical power is consumed wastefully.

In addition, the display processing system 1 of the present exemplary embodiment presents the information, by which the stability of service can also be grasped at a glance when viewed together with the above-described information, so that the situation of the occurrence of a failure due to heat accumulation does not have an adverse effect on the quality of the service provided.

In particular, in the display processing system 1 of the present exemplary embodiment, it is preferable that supervisors, managers, or the like among administrators of the data center 5 can grasp the above-described information at a glance when they view the screen.

The display processing apparatus 200 of the present exemplary embodiment includes a display unit 208 that displays the occurrence status information of a failure, which has occurred due to heat accumulation of the server 7 (FIG. 1) that provides the service, for a predetermined period of time, according to the level of the effect of the failure on the service, and also displays the energy efficiency information of the server 7 for the predetermined period of time so as to be associated with the failure occurrence status information.

In addition, each constitutional element of the display processing apparatus 200 is realized by any combination of hardware and software of the computer 10 including the CPU 12, the memory 14, a program for realizing the constitutional elements in FIG. 1 which is loaded into the memory 14, the storage device 16 such as a hard disk which stores the program, and the interface for network connection 18, which have been described with reference to FIG. 1. In addition, it will be understood by those skilled in the art that various modifications of the implementation method and the apparatus may be made. Each drawing described below does not show the configuration of a hardware unit but shows a block of a functional unit.

The computer program of the present exemplary embodiment is described so as to cause the computer 10 (FIG. 1) for realizing the display processing apparatus 200 to execute a procedure for displaying the occurrence status information of a failure, which has occurred due to heat accumulation of the server 7 that provides the service, for a predetermined period of time, on the display device 30 (FIG. 1) according to the level of the effect of the failure on the service and also displaying the energy efficiency information of the server 7 for the predetermined period of time on the display device 30 (FIG. 1) so as to be associated with the failure occurrence status information.

The computer program of the present exemplary embodiment may be recorded on a computer-readable recording medium. The recording medium is not particularly limited, and various forms of recording media may be used. In addition, a program may be loaded from the recording medium into the memory of the computer, or may be downloaded to the computer through the network and be loaded into the memory.

Specifically, the display processing apparatus 200 of the present exemplary embodiment includes a temperature acquisition unit 202, a calculation unit 204, a counting unit 206, and a display unit 208. In addition, in the present exemplary embodiment, it is assumed that the occurrence status information of a failure, which has occurred due to heat accumulation of the server 7 that provides the service, for a predetermined period of time, described in the display processing apparatus 100 shown in FIG. 2 is acquired from other apparatuses through the network 3. A specific example of the configuration obtained by combining the configuration of the display processing apparatus 100 in FIG. 2 to calculate the occurrence status information of a failure, which has occurred due to heat accumulation of the server 7 that provides the service, for a predetermined period of time, and the configuration of the display processing apparatus 200 of the present exemplary embodiment will be described in detail in an exemplary embodiment to be described later.

The temperature acquisition unit 202 acquires the temperature information measured by temperature sensors (not shown in the drawings), which are arranged around the servers 7, through the network 3.

The calculation unit 204 calculates the energy efficiency information of the server 7 for the predetermined period of time on the basis of the temperature information acquired by the temperature acquisition unit 202.

Specifically, the calculation unit 204 calculates the total time of supercooling for which the temperature acquired by the temperature acquisition unit 202 is equal to or lower than a predetermined temperature in a predetermined period of time. The predetermined temperature is a temperature that can be recognized as supercooling in terms of system operation, and may be set in advance or may be set and changed when necessary through a setting screen (not shown in the drawings) operated by the operator.

The calculation unit 204 may further include a power consumption acquisition section (not shown in the drawings) that acquires power consumption (kwh) of the server 7 through the network 3. In addition, the calculation unit 204 may calculate the sum of power consumption (kwh) of the server 7, which is acquired by the power consumption acquisition section, for a predetermined period of time. In addition, electric bill for one month may be acquired through the network 3 instead of power consumption acquired by the power consumption acquisition section, and this may be counted as the electric bill (Yen) for a predetermined period of time.

In addition, the calculation unit 204 calculates an increasing or decreasing tendency in the total power consumption for a predetermined period of time calculated as described above. Specifically, the calculation unit 204 calculates an average ratio, such as a change rate (%) or a difference (kwh) between the average value of the sum of the power consumption of a past fixed period and the sum of the power consumption for a predetermined period of time, for example. The calculated average ratio may be a difference or the amount of change with respect to the standard value set in advance on the basis of the past power consumption.

The counting unit 206 acquires the occurrence status information of a failure, which has occurred due to heat accumulation of the server 7 that provides the service, for a predetermined period of time, through the network 3 and counts it.

The display unit 208 displays the occurrence status information of a failure, which has occurred due to heat accumulation of the server 7 that provides the service, for a predetermined period of time, counted by the counting unit 206 according to the level of the effect of the failure on the service, and also displays the calculated energy efficiency information of the server 7 for the predetermined period of time on the display device 30 (FIG. 1) so as to be associated with the failure occurrence status information.

Figure 8:
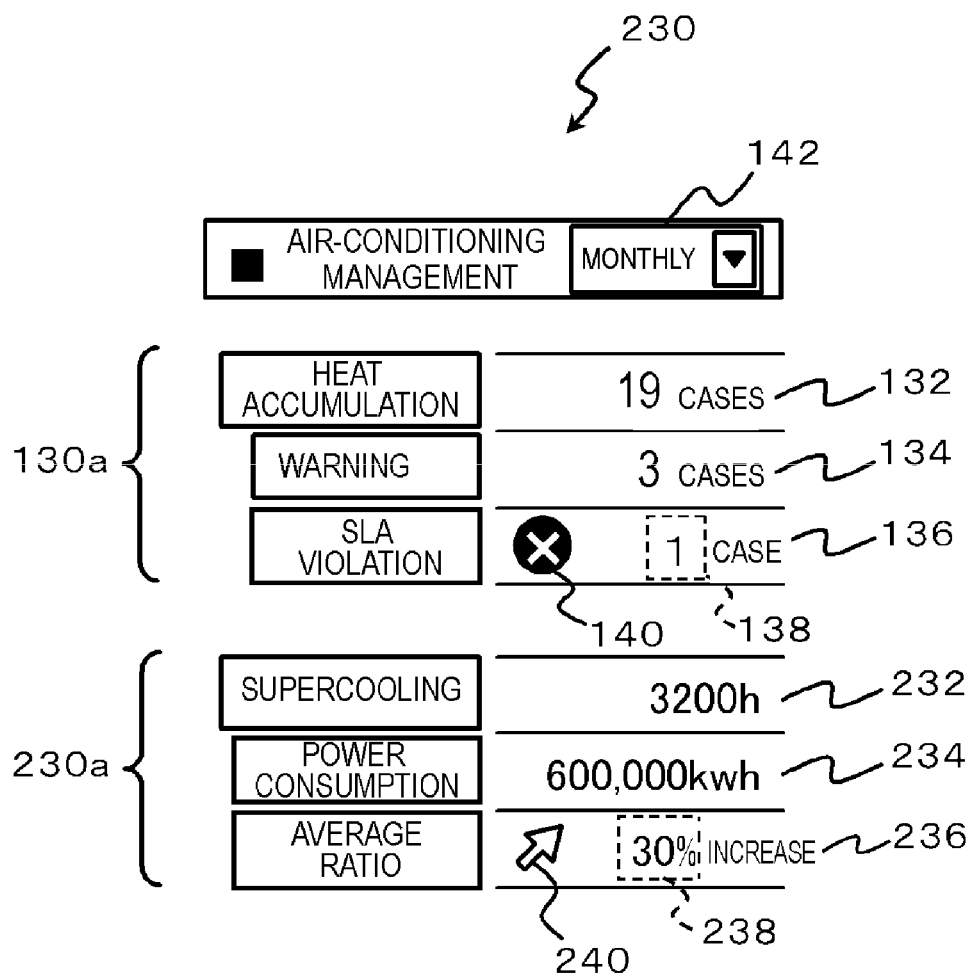
FIG. 8 is a diagram showing an example of a display screen of the display processing system according to the exemplary embodiment of the present invention.

FIG. 8 is a diagram showing an example of a screen 230 of the display processing system 1 of the present exemplary embodiment.

As shown in FIG. 8, the screen 230, which is displayed on the display device 30 (FIG. 1) by the display unit 208 (FIG. 7), further includes a supercooling information display column 230a in addition to a heat accumulation failure information display column 130a to display the heat accumulation occurrence status information, which is the same as that of the screen 130 shown in FIG. 3 in the above-described exemplary embodiment.

In the same manner as in FIG. 3, the period selection list 142 may be provided on the screen 230. Using the period selection list 142, an operation to select the counting period of the number of occurrences displayed in each display portion may be received. The counting period may be selected from predetermined periods of time as described above. In FIG. 8, the counting result of the past one month is displayed.

It should be noted that, although a configuration of displaying only the recent history is adopted in the present exemplary embodiment, the present invention is not limited thereto. The past may also be referred to. In the present invention, however, it is not a prioritized object to investigate the cause and the like of a failure that has occurred by viewing the screen 230, but it is preferable to display at least the current status. This is because, in the present invention, priorities are given to being able to recognize that there is no effect of a failure on the quality of the service or recognize that supercooling has not occurred, being able to recognize supercooling quickly or recognize quickly that there is an effect on the quality, being able to recognize how much the quality has been affected, and being able to recognize the degree of seriousness or the amount of energy uselessly consumed.

Total time of supercooling for which the temperature acquired by the temperature acquisition unit 202 (FIG. 7), which has been counted for a predetermined period of time selected from the period selection list 142 by the calculation unit 204 (FIG. 7), is equal to or lower than a predetermined temperature is displayed in a supercooling period display portion 232.

The sum of power consumption (kwh) of the server 7 (FIG. 1), which has been counted for a predetermined period of time selected from the period selection list 142 by the calculation unit 204, is displayed in a power consumption display portion 234.

The average ratio of the sum of power consumption, which has been counted for a predetermined period of time selected from the period selection list 142 by the calculation unit 204, is displayed in an average ratio display portion 236.

For example, on the screen 230, when the average ratio tends to increase by a predetermined value (in the present exemplary embodiment, 20%) or more, highlighting 238 of an average ratio display portion is performed, and an icon 240 for notifying the administrator that the average ratio tends to increase is displayed near an average ratio display portion 236. As examples of the highlighting 238, various methods, such as changing the color to red, making the character thick, making the character blink, and changing the background color for highlighting, may be considered. In the present exemplary embodiment, for example, an upward red arrow is used as the icon 240. However, the icon 240 is not limited thereto. For example, the icon 240 may be other characters or symbols indicating an undesirable trend, such as "X (cross mark)" or "NG", or may be other images. It is preferable to use an icon by which an operator can recognize an increasing tendency of the average ratio visually intuitively.

In addition, when the average ratio tends to decrease, it is possible to display the icon 240 of a downward green arrow, other characters or symbols indicating a good trend without a problem, such as "○ (circle)" or "OK", of other images. It is preferable to use an icon by which an operator can recognize a decreasing tendency of the average ratio visually intuitively. Alternatively, when there is no change in the average ratio, that is, when the average ratio is the same level as the standard value, it is possible to display the icon 240 of a horizontal green arrow, other characters or symbols indicating a good trend without a problem, such as "○ (circle)" or "OK", of other images. It is preferable to use an icon by which an operator can recognize visually intuitively that the average ratio is the same level as the standard value.

Through the display of the icon 240 or the highlighting 238, the administrator who sees the screen 230 can easily recognize a state, such as an increasing tendency of power consumption due to supercooling, visually intuitively.

In addition, in the display processing system 1 of the present exemplary embodiment, the display processing apparatus 200 may further include a determination unit (not shown in the drawings) that determines whether or not the difference or the change rate calculated by the calculation unit 204 is within the allowable range with respect to the standard value and a determination notification unit (screen 230 in FIG. 8) that notifies a user of the determination result of the determination unit.

Although not shown in FIG. 8, for example, in the same manner as the average ratio display portion 236, a numerical display portion may be highlighted or an icon may be displayed near the numerical display portion when the value of the supercooling period display portion 232 is outside the allowable range with respect to the standard value, for example, when the value of the supercooling period display portion 232 is equal to or more than a predetermined time, or when the value of the power consumption display portion 234 is outside the allowable range with respect to the standard value, for example, when the value of the power consumption display portion 234 is equal to or more than the predetermined amount of power consumption. In this manner, it is possible to easily recognize the state visually intuitively. The allowable range for highlighting or icon display may be set in advance or may be set and changed when necessary through a setting screen (not shown in the drawings) operated by the operator.

The operation of the display processing system 1 of the present exemplary embodiment configured in this manner will be described below.

Figure 9:
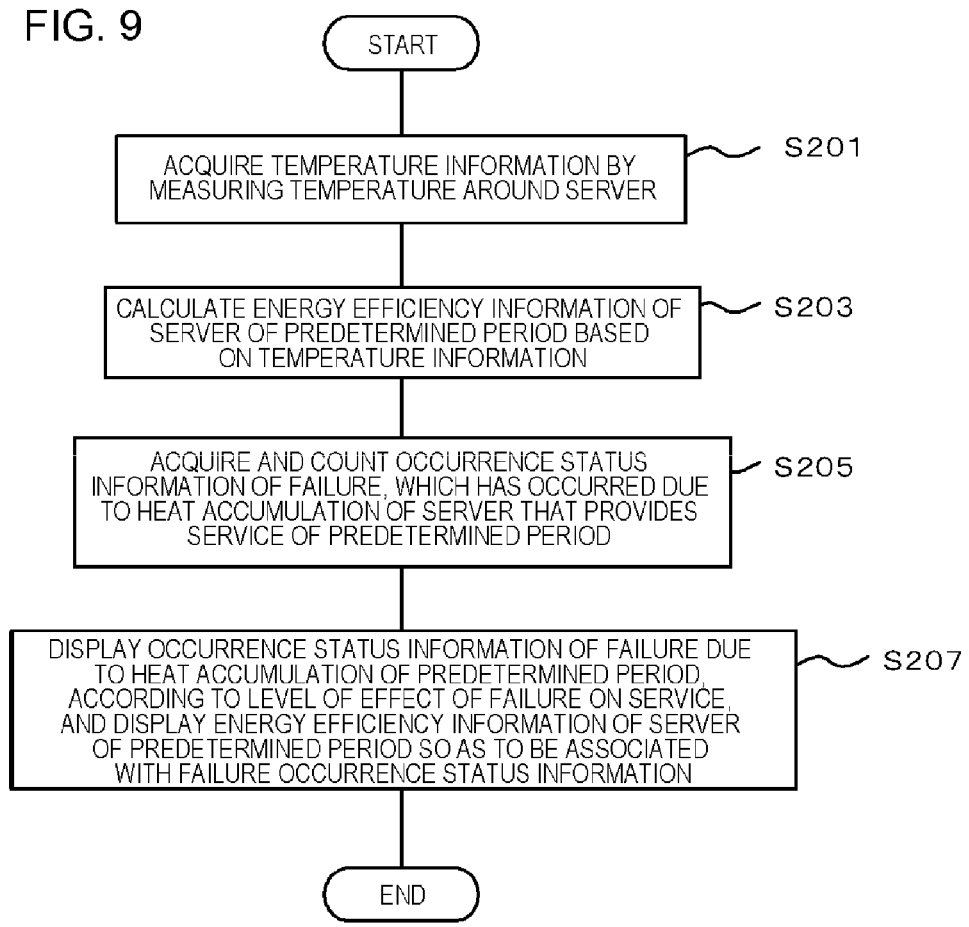
FIG. 9 is a flow chart showing an example of the operation of the display processing system according to the exemplary embodiment of the present invention.

FIG. 9 is a flow chart showing an example of the operation of the display processing system 1 of the present exemplary embodiment. Hereinafter, the flow chart will be described with reference to FIGS. 1 and 7 to 9.

In a display processing method of the present exemplary embodiment, the display processing apparatus 200 (FIG. 7) displays the occurrence status information of a failure, which has occurred due to heat accumulation of the server 7 (FIG. 1) that provides the service, for a predetermined period of time, on the display device 30 (FIG. 1) according to the level of the effect of the failure on the service, and also displays the energy efficiency information of the server 7 for the predetermined period of time on the display device 30 (FIG. 1) so as to be associated with the failure occurrence status information (step S207).

Specifically, in the display processing system 1 of the present exemplary embodiment, first, the temperature acquisition unit 202 (FIG. 7) of the display processing apparatus 200 acquires the temperature information measured by temperature sensors (not shown in the drawings), which are arranged around the servers 7 (FIG. 1), through the network 3 (FIG. 1) (step S201).

Then, the calculation unit 204 (FIG. 7) of the display processing apparatus 200 calculates the energy efficiency information of the server 7 for the predetermined period of time on the basis of the temperature information acquired by the temperature acquisition unit 202 (step S203).

Then, the counting unit 206 (FIG. 7) of the display processing apparatus 200 acquires and counts the occurrence status information of a failure, which has occurred due to heat accumulation of the server 7 that provides the service, for the predetermined period of time, through the network 3 (step S205).

Then, the display unit 208 (FIG. 7) of the display processing apparatus 200 displays the occurrence status information of the failure, which has occurred due to heat accumulation of the server 7 that provides the service and which is counted by the counting unit 206 for the predetermined period of time, according to the level of the effect of the failure on the service, and also displays the calculated energy efficiency information of the server 7 for the predetermined period of time so as to be associated with the failure occurrence status information (step S207).

Not only the number of occurrences of heat accumulation in this one month, the number of occurrences of warning due to heat accumulation in this one month, and the number of occurrences of SLA violation in this one month but also the total time for which the temperature is equal to or lower than the specified temperature (for example, 17° C.) due to supercooling in this one month, power consumption in this one month, and the value of an increase or decrease in power consumption when compared with the standard value in this one month are displayed on the screen 230 shown in FIG. 8. Here, it can be grasped at a glance, through the icon 140 and the highlighting 138, that SLA violation has occurred due to failure caused by heat accumulation and, through the icon 240 and the highlighting 238, that the power consumption has increased by 30% from the standard value due to supercooling.

In addition, in this flow chart, the process of steps S201 and S203 may be constantly executed repeatedly at predetermined periods of time. Step S205 does not necessarily need to be executed every predetermined period of time, and may be performed at the timing when the counted value in each predetermined period of time can be calculated.

In addition, the display update process of step S207 may be performed only when the operator gives an instruction to display the screen 230 with an operation button (not shown in the drawings) or the like. In addition, in a state where the screen 230 in FIG. 8 is displayed by the display unit 208 (FIG. 7), when the information to be displayed in the display portion of the number of occurrences of heat accumulation 132, and the display portion of the number of occurrences of warning 134, the display portion of the number of occurrences of SLA violation 136 has changed, especially, when warning or SLA violation occurs, it is preferable to update the display immediately. Here, whether to set the display update as automatic update or manual update using an operation button (not shown in the drawings) or the like, an automatic update period, and the like may be set in advance or may be set and changed when necessary through a setting screen (not shown in the drawings) operated by the operator.

As described above, according to the display processing system 1 of the present exemplary embodiment, the same effects as in the above-described exemplary embodiment are obtained, and the relationship between the effect of heat accumulation on the service and energy efficiency can be visualized. As a result, the reliability of service is improved.

Third Exemplary Embodiment

Figure 10:
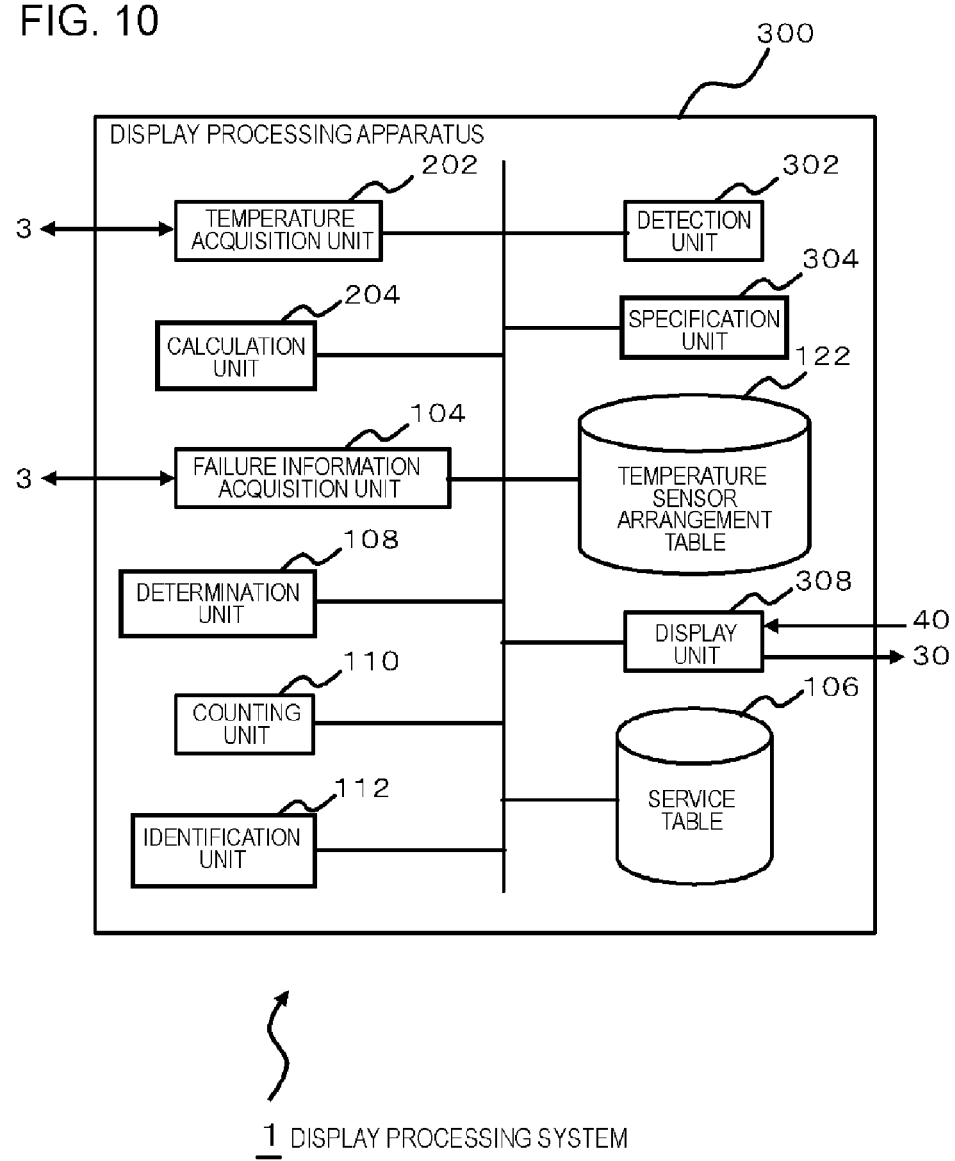
FIG. 10 is a functional block diagram showing the configuration of a display processing apparatus of a display processing system according to an exemplary embodiment of the present invention.

FIG. 10 is a functional block diagram showing the configuration of a display processing apparatus 300 realized by the computer of the display processing system 1 according to the exemplary embodiment of the present invention. The display processing apparatus 300 of the display processing system 1 of the present exemplary embodiment has a function realized by combining the display processing apparatuses of the display processing system 1 of the above-described exemplary embodiments shown in FIGS. 2, 4, and 7. The display processing apparatus 300 of the display processing system 1 of the present exemplary embodiment calculates the occurrence status information of heat accumulation of a server, the occurrence status information of a failure due to heat accumulation, and energy efficiency, and presents such information and the effect of heat accumulation on the service so as to be associated with each other.

Specifically, the display processing apparatus 300 of the display processing system 1 of the present exemplary embodiment includes the failure information acquisition unit 104, the service table storage unit 106, the determination unit 108, the counting unit 110 and the identification unit 112 that are the same as in the display processing apparatus 100 of the above-described exemplary embodiment shown in FIG. 2, the same temperature sensor arrangement table storage unit 122 as in FIG. 4, and the temperature acquisition unit 202 and the calculation unit 204 that are the same as in the display processing apparatus 200 of the above-described exemplary embodiment shown in FIG. 7, and also further includes a detection unit 302, a specification unit 304, and a display unit 308.

The detection unit 302 detects the occurrence of heat accumulation on the basis of the temperature information acquired by the temperature acquisition unit 202. The detection unit 302 detects the occurrence of heat accumulation on the basis of the position and the period when the temperature information of the temperature sensor is equal to or more than a threshold value set in advance.

The specification unit 304 specifies at least one server 7 (FIG. 1), in which the detected heat accumulation has occurred, with reference to the temperature sensor arrangement table storage unit 122, and outputs the occurrence status information of heat accumulation of the specified server 7.

The display unit 308 displays the occurrence status information of a failure, which has occurred due to heat accumulation of the server 7 that provides the service, for a predetermined period of time, counted by the counting unit 110 according to the level of the effect of the failure on the service, and also displays the energy efficiency information of the server for the predetermined period of time, which has been calculated by the calculation unit 204, so as to be associated with the failure occurrence status information. The display unit 308 displays the above-described screen 230, which is shown in FIG. 8, on the display device 30 (FIG. 1).

The operation of the display processing system 1 of the present exemplary embodiment configured in this manner will be described below.

Figure 11:
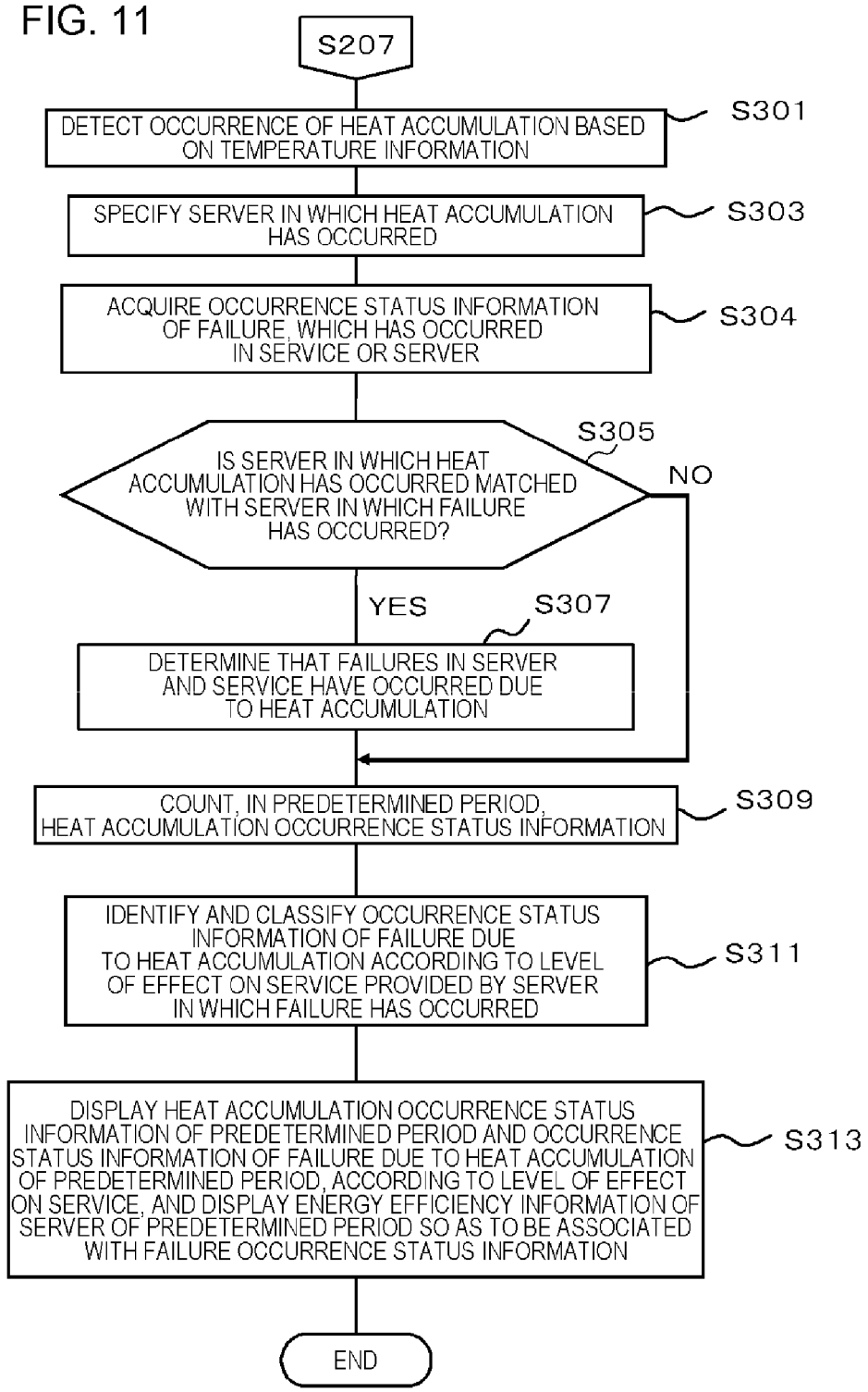
FIG. 11 is a flow chart showing an example of the operation of the display processing system according to the exemplary embodiment of the present invention.

FIG. 11 is a flow chart showing an example of the operation of the display processing system 1 of the present exemplary embodiment. Hereinafter, the flow chart will be described with reference to FIGS. 1 and 6 to 11.

Note that, although not limited to this, it is assumed that the display processing apparatus 300 of the present exemplary embodiment performs the process of the flow chart shown in FIG. 11 after performing the process of the same steps S201 to S207 as in the flow chart shown in FIG. 9 in the display processing apparatus 200 of the above-described exemplary embodiment. Here, explanation of the process of the flow chart shown in FIG. 9 will not be repeated.

The detection unit 302 of the display processing apparatus 300 detects the occurrence of heat accumulation on the basis of the temperature information that the temperature acquisition unit 202 (FIG. 10) of the display processing apparatus 300 has acquired from the management device (not shown in the drawings) of the data center 5 (FIG. 1) through the network 3 (FIG. 10) (step S301).

Then, the specification unit 304 (FIG. 10) of the display processing apparatus 300 specifies at least one server 7 (FIG. 1), in which the detected heat accumulation has occurred, with reference to the temperature sensor arrangement table storage unit 122, and outputs the occurrence status information of heat accumulation of the specified server 7 (step S303).

Then, the failure information acquisition unit 104 (FIG. 10) of the display processing apparatus 300 acquires the occurrence status information of a failure, which has occurred in the service or the server 7 (FIG. 1), from the data center 5 (FIG. 1) through the network 3 (step S304).

Then, the determination unit 108 (FIG. 10) of the display processing apparatus 300 determines whether or not the server 7 in which the heat accumulation has occurred, which has been specified by the specification unit 304, matches the server 7 in which the failure has occurred, of which information has been acquired by the failure information acquisition unit 104 (step S305). When the server 7 in which the heat accumulation has occurred matches the server 7 in which the failure has occurred (YES in step S305), it is determined that the failures in the server 7 and the service have occurred due to heat accumulation (step S307), and the process proceeds to step S309. When the server 7 in which the heat accumulation has occurred does not match the server 7 in which the failure has occurred (NO in step S305), step S307 is skipped and the process proceeds to step S309 since the failures have not occurred due to heat accumulation.

Then, the counting unit 110 (FIG. 10) of the display processing apparatus 300 counts the acquired occurrence status information of heat accumulation of the server 7 and the occurrence status information of the failure, which is determined to have occurred due to the heat accumulation, for a predetermined period of time (step S309).

In addition, although the process of steps S301 to S307 may be constantly executed repeatedly at predetermined periods of time and step S309 may be executed every predetermined period of time, explanation of the repeated process will not be repeated in this drawing.

Then, the identification unit 112 (FIG. 10) of the display processing apparatus 300 specifies the SLA rank of the service provided by the server 7, which is determined that the failure has occurred, on the basis of the server rank table 152 (FIG. 6(b)) with reference to the service table storage unit 106 (FIG. 10) of the display processing apparatus 300. Then, the identification unit 112 of the display processing apparatus 300 identifies the level of the effect of the failure on the service from the reference value of the specified rank on the basis of the failure level table 150 (FIG. 6(a)), and performs classification regarding whether the identified level is a warning level or an SLA violation level, for example (step S311).

Then, the display unit 308 (FIG. 10) of the display processing apparatus 300 displays the counted heat accumulation occurrence status information for the predetermined period of time and the occurrence status information of a failure, which has occurred due to heat accumulation for the predetermined period of time, according to the level of the effect on the service classified by the identification unit 112 of the display processing apparatus 300, and also displays the energy efficiency information of the server for the predetermined period of time so as to be associated with the failure occurrence status information (step S313).

As described above, according to the display processing system 1 of the present exemplary embodiment, the same effects as in the above-described exemplary embodiments are obtained. In addition, the heat accumulation occurrence situation and the situation of the occurrence of a failure due to heat accumulation can be grasped and the relationship between the effect of heat accumulation on the service and energy efficiency can be visualized on the basis of such information.

Fourth Exemplary Embodiment

FIG. 12 is a diagram showing an example of a screen 330 of the display processing system 1 of the present exemplary embodiment.

The display processing system 1 of the present exemplary embodiment is different from the display processing systems of the above-described exemplary embodiments in that the degree of effect of heat accumulation for a predetermined period of time on the operation of service is calculated and presented so as to be associated with energy efficiency.

In the display processing system 1 of the present exemplary embodiment, a display processing apparatus further includes a degree-of-effect calculation unit (not shown in the drawings) in addition to the configuration of the display processing apparatus 300 (FIG. 10).

The degree-of-effect calculation unit calculates the degree of effect of heat accumulation for a predetermined period of time on the operation of service on the basis of the occurrence status information of heat accumulation of the server 7 (FIG. 1), the occurrence status information of a failure due to heat accumulation, or the level of the effect of heat accumulation on the operation of service, for the predetermined period of time.

In addition, the display unit 308 (FIG. 10) displays the degree of effect on the operation of service and the energy efficiency information of the server for the predetermined period of time so as to be associated with each other.

Specifically, the degree of effect may be calculated by multiplying each of the number of occurrences of heat accumulation, the number of occurrences of warning, and the number of occurrences of SLA violation by the weighting coefficient according to the prescribed rules. The following calculation equation (1) of the degree of effect is an example, and the present invention is not limited thereto. In addition, the calculation expression or each coefficient may be set in advance or may be set and changed when necessary through a setting screen (not shown in the drawings) operated by the operator.

$$\text{Degree of effect} = \quad\quad\quad \text{equation (1)}$$
$$\text{number of occurrences of heat accumulation} \times a +$$
$$\text{number of occurrences of warning} \times b +$$
$$\text{number of occurrences of SLA violation} \times c$$

Here, a, b, and c are weighting coefficients. In the present exemplary embodiment, it is assumed that a=0, b=3, and c=5, for example.

For example, when the number of occurrences of heat accumulation is 19, the number of occurrences of warning is 3, and the number of occurrences of SLA violation is 1 as shown in FIG. 8, the degree of effect is calculated as 14 by the following equation (2).

$$19*0+3*3+1*5=14 \quad\quad\quad \text{equation (2)}$$

The degree of effect calculated in this manner is used when the energy efficiency information and the degree of effect on the service are displayed on a screen so as to be associated with each other as will be described later.

The operation of the display processing apparatus of the present exemplary embodiment configured as described above has the same steps S301 to S311 as in the flow chart of FIG. 11, which shows the operation of the display processing apparatus 300 of the above-described exemplary embodiment, and further has the following steps S413 and S415 (not shown in the drawings) instead of step S313 subsequent to step S311.

That is, the degree-of-effect calculation unit of the display processing apparatus calculates the degree of effect of heat accumulation for a predetermined period of time on the operation of service on the basis of the occurrence status information of heat accumulation of the server 7 (FIG. 1), the occurrence status information of a failure due to heat accumulation, or the level of the effect of heat accumulation on the service, in the predetermined period of time (step S413).

Then, the display unit 308 (FIG. 10) of the display processing apparatus 300 displays the degree of effect on the operation of service and the energy efficiency information of the server for the predetermined period of time so as to be associated with each other (step S415). In addition, the display unit 308 may display the counted heat accumulation occurrence status information for the predetermined period of time and the occurrence status information of a failure, which has occurred due to heat accumulation, for the predetermined period of time, according to the level of the effect on the service classified by the identification unit 112 (FIG. 10) of the display processing apparatus 300.

As shown in FIG. 12(a), in the screen 330 that is displayed on the display device 30 by the display unit 308, the calculated energy efficiency information (power consumption) for the server of the predetermined period of time and the calculated degree of effect (service level) on the operation of service for the predetermined period of time are plotted 331 so as to be respectively allocated to the axes of a two-dimensional matrix.

In addition, FIG. 12(a) shows a graph in February, and FIGS. 12(b) and 12(c) show graphs in April. In the display processing apparatus 300 of the present exemplary embodiment, it is assumed that a user interface for operation reception, such as a selection list (not shown in the drawings) is provided so that the operator may select the date, week, month, year, period, and the like of the graph to be displayed. In addition, it is also preferable that a plurality of graphs designated by the operator may be displayed side by side.

First and second auxiliary lines 343 and 342, which extend from the predetermined reference value P0 of the energy efficiency information (power consumption) and the predetermined reference value L0 of the degree of effect (service level), respectively, on the two-dimensional matrix so as to be perpendicular to the axes of the two-dimensional matrix, are shown on the screen 330, and the plot region of the two-dimensional matrix is divided into four parts. Each reference value may be set in advance or may be set and changed when necessary through a setting screen (not shown in the drawings) operated by the operator. For example, when the reference value is far from the practical violation, it may be appropriately modified.

In addition, the screen 330 has a first region 351 (dashed-dotted line in FIG. 12(c)), a second region 352 (dashed double-dotted line in FIG. 12(c)), a third region 353 (dotted line in FIG. 12(c)), and a fourth region 354 (solid line in FIG. 12(c)).

The first region 351 is a plot region when the calculated energy efficiency information (power consumption) is less than the reference value P0 and the calculated degree of effect (service level) is less than the reference value L0.

The second region 352 is a plot region when and the calculated energy efficiency information (power consumption) are less than the reference value P0 and the calculated degree of effect (service level) is equal to or more than the reference value L0.

The third region 353 is a plot region when the calculated energy efficiency information (power consumption) is equal to or more than the reference value P0 and the calculated degree of effect (service level) is less than the reference value L0.

The fourth region 354 is a plot region when the calculated energy efficiency information (power consumption) is equal to or more than the reference value P0 and the calculated degree of effect (service level) is equal to or more than the reference value L0.

The display processing apparatus 300 of the present exemplary embodiment may further include a reference determination unit (not shown in the drawings) that determines whether or not a predetermined threshold value of the energy efficiency information and the degree of effect respectively satisfy the reference values determined in advance. In the present exemplary embodiment, a normal state without a problem is when both the energy efficiency information and the degree of effect are smaller values than the reference values. In the two-dimensional matrix of the screen 330, the value on each axis is decreased toward the arrow direction to indicate a normal state.

On the screen 330, the background color of each region is changed and displayed on the basis of the determination result of the reference determination unit. For example, as shown in FIG. 12(c), when the energy efficiency information (power consumption) and the degree of effect (service level) respectively exceed the reference values, the background colors of the second region 352 and the third region 353 are respectively changed to pink. In addition, when the energy efficiency information (power consumption) and the degree of effect (service level) do not respectively exceed the reference values, the background colors of the second region 352 and the third region 353 are respectively changed to yellow-green.

In addition, when both the energy efficiency information (power consumption) and the degree of effect (service level) exceed the reference values, the background color of the fourth region 354 may be changed to pink. In addition, when either one of the energy efficiency information (power consumption) or the degree of effect (service level) exceeds the reference value, the background color of the fourth region 354 may be changed to yellow-green. In addition, when both the energy efficiency information (power consumption) and the degree of effect (service level) are less than the reference values, the background color of the fourth region 354 may be changed to yellow-green.

For example, in FIG. 12(a), both the energy efficiency information (power consumption) and the degree of effect (service level) exceed the reference values as indicated by the plot 331. Accordingly, the background colors of all of the second region 352, the third region 353, and the fourth region 354 are displayed in pink. In addition, as shown in FIG. 12(a), first and second auxiliary broken lines 332 and 333, which are drawn from the plot 331 so as to be perpendicular to the first and second auxiliary lines 343 and 342 drawn from the reference value P0 of the energy efficiency information (power consumption) and the reference value L0 of the degree of effect (service level), respectively, may be shown.

In addition, on the screen 330, images (in FIG. 12(a), a first evaluation icon 362, a second evaluation icon 363, and a third evaluation icon 364) showing the determination results of the calculated energy efficiency information (power consumption) and the calculated degree of effect (service level) are displayed in the second region 352, the third region 353, and the fourth region 354 on the basis of the determination result of the reference determination unit.

For example, these images (first, second and third evaluation icons) may display the icon of NG mark (red circle) when neither the energy efficiency nor the degree of effect satisfies the reference. Alternatively, when either the energy efficiency or the degree of effect satisfies the reference, the icon of attention mark (yellow triangle!) may be displayed, or the icon of OK mark (green circle) may be displayed. In this manner, it is possible to notify the user of the situation so that the situation is intuitively understandable.

As shown in a plot 371 of FIG. 12(b), when the degree of effect (service level) satisfies the reference value L0, the background color of the second region 352 is changed to yellow-green, and a first evaluation icon 382 of OK mark indicating that the degree of effect (service level) satisfies the reference value L0 is further displayed in the second region 352. In the example shown in FIG. 12(b), it is possible to show a first auxiliary broken line 372 that is drawn from the plot 371 so as to be perpendicular to the first auxiliary line 343 drawn from the reference value P0 of the energy efficiency information (power consumption).

In addition, since the energy efficiency (power consumption) does not satisfy the reference value P0, the background color of the third region 353 is changed to pink, and a second evaluation icon 383 of NG mark indicating that the energy efficiency (power consumption) does not satisfy the reference value P0 is further displayed in the third region 353. In addition, the background color of the fourth region 354 is changed to yellow, and a third evaluation icon 384 of attention mark of a yellow triangle is displayed in the fourth region 354.

As described above, according to the display processing system 1 of the present exemplary embodiment, the same effects as in the above-described exemplary embodiments are obtained, and the relationship between the energy efficiency and the service level can be recognized at a glance through a screen.

While the exemplary embodiments of the present invention have been described with reference to the drawings, these are only illustration of the present invention, and other various configurations may also be adopted.

For example, the display processing apparatus 300 (FIG. 10) of the above-described exemplary embodiment may further include a recording unit (not shown in the drawings) that records, as history, the energy efficiency information of the server 7 (FIG. 1) for a predetermined period of time calculated by the calculation unit 204 (FIG. 10) and the degree of effect on the operation of service for a predetermined period of time calculated by the degree-of-effect calculation unit. In addition, as the recorded history for each predetermined period of time, the display unit 308 (FIG. 10) may display the transition of the energy efficiency information of the server 7 for a predetermined period of time and the degree of effect on the operation of service for a predetermined period of time in time series.

FIG. 13 is a diagram showing an example of the transition graph screen in the display processing system 1 of the present exemplary embodiment.

As shown in FIG. 13, on a screen 430, a bar graph 442 of the degree of effect of heat accumulation on the service, which is indicated by a degree-of-effect legend 432, and a line graph 444 of power consumption due to supercooling, which is indicated by a power consumption legend 434, are displayed in time series for each month along the time axis 440.

A selection list or the like may be provided on the screen 430, so that the operator can select a week unit, a year unit, or the like other than the month unit on the time axis 440 to change the screen display.

In the present exemplary embodiment, as energy efficiency, the amount of power consumed by supercooling is shown using a graph. However, it is also possible to display other energy efficiency information calculated by the above-described calculation unit 204 (FIG. 7 or 10). In addition, a selection list or the like may be provided so that the operator can select it to change the screen display.

Graph types (a bar graph, a line graph, and the like) of the degree of effect and energy efficiency may be appropriately selected by the operator. In addition, a list and the like may be displayed instead of a graph.

In addition, the display processing apparatus 300 of the present exemplary embodiment may include a reception unit (not shown in the drawings) that receives the time when measures against heat accumulation were taken and a presentation unit (icon 460 in FIG. 13(b)) that shows the time using a graph (a bar graph 452 and a line graph 454 of a screen 450 in FIG. 13(b)) or a list.

According to this configuration, it is possible to visually check the effect due to the measures taken. Therefore, if there is no effect, it is possible to take action, such as taking further measures.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2010-265476, filed on Nov. 29, 2010, the disclosure of which is incorporated herein in its entirety by reference.

The invention claimed is:

1. A display processing system, comprising:
a display unit that displays occurrence status information of heat accumulation of servers, which provide services, for a predetermined period of time, and occurrence status information of failure for said predetermined period of time, said failure occurring due to said heat accumulation;
a heat accumulation information acquisition unit that acquires said occurrence status information of said heat accumulation of said servers that provide said services;
a failure information acquisition unit that acquires occurrence status information of failure, said failure occurring in said services or said servers;
a determination unit that determines that said failure in said servers or said services has occurred due to said heat accumulation when at least one of said servers in which said heat accumulation acquired by said heat accumulation information acquisition unit matches at least one of said servers in which the failure has occurred, said failure corresponding to said occurrence status information of said failure acquired by said failure information acquisition unit;
a counting unit that counts the acquired occurrence status information of said heat accumulation of said servers and the occurrence status information of said failure in said predetermined period of time, said failure being determined to have occurred due to said heat accumulation; and
an identification unit that identifies and classifies the counted occurrence status information of said failure for said predetermined period of time according to a level of effect on the service, said service being provided by the server upon which it is determined that said failure has occurred therein by said determined unit,
wherein said display unit displays the counted occurrence status information of said heat accumulation for said predetermined period of time and the counted occurrence status information of said failure for said predetermined period of time, said failure occurring due to said heat accumulation, said counted occurrence status information of said failure being classified according to the level of effect on said service by said identification unit.

2. The display processing system according to claim 1, wherein said heat accumulation information acquisition unit includes
a detection unit, which detects occurrence of said heat accumulation on the basis of temperature information measured by temperature sensors arranged around said servers that provide said services, and
a specification unit, which specifies the server in which the detected heat accumulation has occurred and outputs occurrence status information of said heat accumulation of the specified server.

3. The display processing system according to claim 2, wherein each of said services has a quality assurance level, and said identification unit identifies the counted occurrence status information of said failure for said predetermined period of time on the basis of different criteria according to a level of effect of said failure on the service, each of said criteria being set for each quality assurance level of said service.

4. The display processing system according to claim 1, wherein each of said services has a quality assurance level, and said identification unit identifies the counted occurrence status information of said failure for said predetermined period of time on the basis of different criteria according to a level of effect of said failure on the service, each of said criteria being set for each quality assurance level of said service.

5. A display processing method, comprising:
displaying, by a processing apparatus connected to a display device, occurrence status information of heat accumulation of servers that provide services, for a predetermined period of time, and occurrence status information of failure for said predetermined period of time, said failure occurring due to said heat accumulation;
acquiring, by a heat accumulation information acquisition apparatus, said occurrence status information of said heat accumulation of said servers that provide said services;
acquiring, by a failure information acquisition apparatus, occurrence status information of failure, said failure occurring in said services or said servers;
determining, by a determination apparatus, that said failure in said servers or said services has occurred due to said heat accumulation when at least one of said servers in which said heat accumulation is acquired by said heat accumulation information acquisition apparatus matches at least one of said servers in which the failure has occurred, said failure corresponding to said occurrence status information of said failure acquired by said failure information acquisition apparatus;
counting, by a counting apparatus, the acquired occurrence status information of said heat accumulation of said servers and the occurrence status information of said failure, in said predetermined period of time, said failure being determined to have occurred due to said heat accumulation; and identifying and classifying, by an identification apparatus the counted occurrence status information of said failure for said predetermined period of time according to a level of effect on the service, said service being provided by the server upon which it is determined that said failure has occurred therein by said determining apparatus, wherein said display device displays the counted occurrence status information of said heat accumulation for said predetermined period of time and the counted occurrence status information of said failure for said predetermined period of time, said failure occurring due to said heat accumulation, said counted occurrence status information of said failure being classified according to the level of effect on said service by said identification apparatus.

6. A non-transitory computer-readable storage medium with an executable program stored thereon, wherein the program instructs a computer connected to a display device to execute:

a procedure for displaying, on a display device, occurrence status information of heat accumulation of servers that provide services, for a predetermined period of time, and occurrence status information of failure for said predetermined period of time, said failure occurring due to said heat accumulation;

a procedure for acquiring said occurrence status information of said heat accumulation of said servers that provide said services;

a procedure for acquiring occurrence status information of failure, said failure occurring in said services or said servers;

a procedure for determining that said failure in said servers or said services has occurred due to said heat accumulation when at least one of said servers in which said heat accumulation acquired by said heat accumulation information acquisition unit matches at least one of said servers in which the failure has occurred, said failure corresponding to said occurrence status information of said failure acquired;

a procedure for counting the acquired occurrence status information of said heat accumulation of said servers and the occurrence status information of said failure, in said predetermined period of time, said failure being determined to have occurred due to said heat accumulation; and a procedure for identifying and classifying the counted occurrence status information of said failure for said predetermined period of time according to a level of effect on the service, said service being provided by the server upon which it is determined that said failure has occurred therein, wherein said display device displays the counted occurrence status information of said heat accumulation for said predetermined period of time and the counted occurrence status information of said failure for said predetermined period of time, said failure occurring due to said heat accumulation, said counted occurrence status information of said failure classified according to the level of effect on said service.

* * * * *